United States Patent
Suzuki

(10) Patent No.: US 9,199,459 B2
(45) Date of Patent: Dec. 1, 2015

(54) LIQUID DISCHARGE APPARATUS AND METHOD FOR MANUFACTURING LIQUID DISCHARGE APPARATUS

(71) Applicant: Brother Kogyo Kabushiki Kaisha, Nagoya-shi, Aichi-ken (JP)

(72) Inventor: Yoshihumi Suzuki, Ena (JP)

(73) Assignee: Brother Kogyo Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 14/601,797

(22) Filed: Jan. 21, 2015

(65) Prior Publication Data

US 2015/0202873 A1    Jul. 23, 2015

(30) Foreign Application Priority Data

Jan. 23, 2014 (JP) .................. 2014-010064
Jan. 23, 2014 (JP) .................. 2014-010065

(51) Int. Cl.
*B41J 2/045* (2006.01)
*B41J 2/14* (2006.01)
*H01L 41/25* (2013.01)

(52) U.S. Cl.
CPC ............ *B41J 2/14209* (2013.01); *H01L 41/25* (2013.01)

(58) Field of Classification Search
CPC ............... B41J 2/14209; B41J 2/14233; B41J 2002/14217; B41J 2002/14491; B41J 2002/14306; B41J 2002/14225; B41J 2002/14459
See application file for complete search history.

(56) References Cited

U.S. PATENT DOCUMENTS

| 7,008,048 B2 * | 3/2006 | Sakaida ...................... 347/68 |
| 2003/0156165 A1 | 8/2003 | Sakaida |
| 2005/0068375 A1 | 3/2005 | Hibi et al. |

FOREIGN PATENT DOCUMENTS

| JP | 2003/311954 | 11/2003 |
| JP | 4497850 | 7/2010 |

* cited by examiner

*Primary Examiner* — Juanita D Jackson
(74) *Attorney, Agent, or Firm* — Frommer Lawrence & Haug LLP

(57) ABSTRACT

There is provided a liquid discharge apparatus including a channel structure in which liquid channels including pressure chambers and nozzles are formed and a piezoelectric actuator including a piezoelectric layer arranged on the channel structure to cover the pressure chambers. Two grooves are formed in the piezoelectric layer to locate on two sides of each pressure chamber in an array direction. There is an equal separation distance between the two grooves arranged on the two sides of the pressure chamber. X means positions of the grooves from an edge of the pressure chamber in the array direction, and Xc means an center position between the edge of the pressure chamber to the edge of an adjacent other pressure chamber in the array direction. The positions X of the grooves satisfy $0.2Xc-20\ \mu m \leq X \leq 0.6Xc+20\ \mu m$.

17 Claims, 17 Drawing Sheets

SCANNING DIRECTION

NOZZLE ARRAY DIRECTION
(CONVEYANCE DIRECTION)

NOZZLE ARRAY DIRECTION
(CONVEYANCE DIRECTION)

NOZZLE ARRAY DIRECTION
(CONVEYANCE DIRECTION)

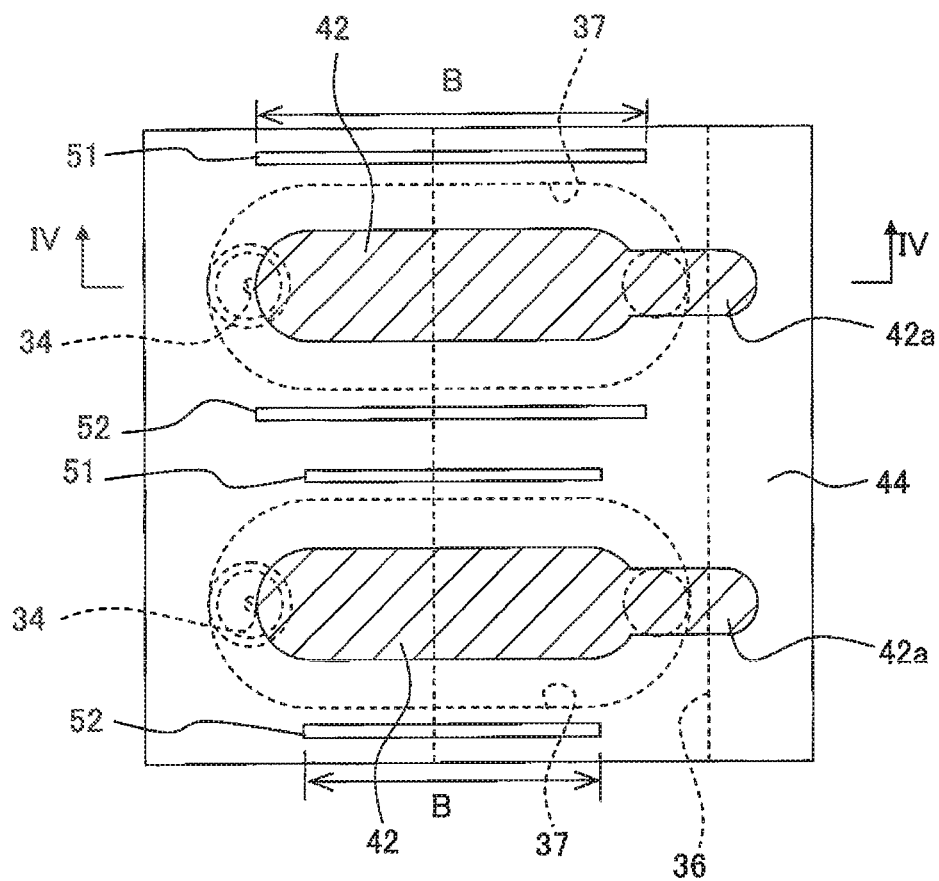

NOZZLE ARRAY DIRECTION
(CONVEYANCE DIRECTION)

NOZZLE ARRAY DIRECTION
(CONVEYANCE DIRECTION)

NOZZLE ARRAY DIRECTION
(CONVEYANCE DIRECTION)

LIQUID DISCHARGE APPARATUS AND METHOD FOR MANUFACTURING LIQUID DISCHARGE APPARATUS

CROSS REFERENCE TO RELATED APPLICATION

The present application claims priority from Japanese Patent Application No. 2014-010064 filed on Jan. 23, 2014 and Japanese Patent Application No. 2014-010065 filed on Jan. 23, 2014 the disclosure of which are incorporated herein by reference in their entirety.

BACKGROUND

1. Field of the Invention

The present invention relates to liquid discharge apparatuses and a method for manufacturing such liquid discharge apparatuses.

2. Description of the Related Art

Conventionally, ink jet heads jetting liquid drops of ink from nozzles are known as liquid discharge apparatuses jetting a liquid. There is known ink jet heads which include a channel structure (channel unit) in which ink channels are formed to include a plurality of nozzles, and a piezoelectric actuator (actuator unit) joined to the channel unit.

The channel unit has a plurality of pressure chambers in respective communication with the plurality of nozzles. The piezoelectric actuator has four piezoelectric layers (piezoelectric sheets) arranged to cover the plurality of pressure chambers, a plurality of individual electrodes arranged on one surface of the upmost piezoelectric layer to face the plurality of pressure chambers respectively, and a common electrode arranged on the other surface of the upmost piezoelectric layer. Further, in the upper surface of the upmost piezoelectric layer, grooves are formed to correspond respectively to the plurality of pressure chambers. In more detail, in a planar direction of the piezoelectric layers, two grooves are formed in such a position as to interpose each pressure chamber therebetween.

In the piezoelectric actuator, when a drive voltage is applied between an individual electrode and the common electrode, contraction in the planar direction occurs in such a portion of the upmost piezoelectric layer as interposed between the individual electrode and the common electrode, thereby causing the four Piezoelectric layers to deform as projecting toward the corresponding pressure chamber. Because this deformation of the piezoelectric layers also changes the volume of the pressure chamber, the pressure on the ink inside the pressure chamber rises, thereby jetting the ink from the nozzle.

SUMMARY

By forming the grooves in a portion of the piezoelectric layer around each pressure chamber to correspond to each of the plurality of pressure chambers, it is possible to intensify the deformation in an area of the piezoelectric layers facing each pressure chamber. If the piezoelectric layers increase in the amount of deformation, then because the pressure chamber has thus undergone a larger amount of volume change, a higher pressure is exerted on the ink inside the pressure chamber so as to raise the speed of jetting the ink from the nozzle.

However, the closer the grooves are positioned to the edge of the pressure chamber, the higher the effect is in intensifying the deformation of the piezoelectric layers, whereas the farther the grooves are positioned away from the edge of the pressure chamber, the lower the effect is in intensifying the deformation. That is, different positions of the grooves exert different influence on the speed of jetting the liquid from the nozzle. However, in such a piezoelectric actuator as described above, the grooves may have positional variation with respect to any pressure chamber among the plurality of pressure chambers. For example, due to sonic manufacturing error in forming the plurality of pressure chambers in the channel unit, some pressure chambers may be formed deviating from the correct positions. Otherwise, some pressure chambers may be formed in a little different shape from other pressure chambers. In such cases, among the plurality of pressure chambers, there may be variation in the positional relation between the pressure chamber and the grooves. In this manner, if the grooves have positional difference with respect to any pressure chamber among the plurality of pressure chambers, then the positional variation in the grooves will give rise to variation in the jet speed among the plurality of nozzles in respective communication with the plurality of pressure chambers.

However, in such a liquid discharge apparatus as described above, while it is ideal for the jet speed and jet volume of the liquid jetted from one nozzle to be identical to another among the plurality of nozzles, there is such a problem that variation in the jet speed may arise from various factors.

Accordingly, it is an object of the present teaching to provide a liquid discharge apparatus wherein even if the two grooves have positional difference with respect to any pressure chamber among the plurality of pressure chambers, there is still little influence from that on the variation in the jet speed.

It is another object of the present teaching to suppress the variation in the speed of jetting the liquid among the plurality of nozzles due to different positions or shapes of the grooves in the liquid discharge apparatus having the piezoelectric actuator in which the grooves are formed in the piezoelectric layer.

According to a first aspect of the present teaching, there is provided A liquid discharge apparatus configured to discharge liquid, including:

a channel structure in which liquid channels are formed to include a plurality of nozzles aligned in an array direction and a plurality of pressure chambers communicating with the plurality of nozzles respectively and aligned in the array direction; and a piezoelectric actuator including a piezoelectric layer arranged on the channel structure to cover the plurality of pressure chambers, wherein for each of the plurality of pressure chambers, two grooves are formed in the piezoelectric layer to locate on two sides of each pressure chamber in the array direction, and to extend respectively in an orthogonal direction orthogonal to the array direction;

wherein among the plurality of pressure chambers, there is an equal separation distance between the two grooves arranged on the two sides of the pressure chamber; and wherein when letting X be positions of the grooves from an edge of the pressure chamber in the array direction, and letting Xc be a center position between the edge of the pressure chamber to the edge of an adjacent other pressure chamber in the array direction, the positions X of the grooves satisfy $0.2Xc-20\ \mu m \leq X \leq 0.6Xc+20\ \mu m$.

According to the present teaching, as a premise, the distance between the two grooves located on two sides of each pressure chamber is maintained equal among the plurality of pressure chambers. Therefore, if the two grooves undergo positional deviation with respect to each pressure chamber, then the two grooves deviate with respect to the pressure chamber in the same direction by the same amount. Hence, if the increase in the amount of volume change of the pressure chamber because the groove on one side comes close to the edge of the pressure chamber cancels out the decrease in the amount of volume change of the pressure chamber because the groove on the other side moves away from the edge of the pressure chamber, then the positional variation of the grooves almost does not affect the speed of jetting the liquid from the nozzles.

As will be described later, if a curve is applied to approximate a relationship between the positions X of the grooves from the edge of the pressure chamber, and the amount of volume change of the pressure chamber when the piezoelectric layer has deformed, then the curve takes its maximal value in the vicinity of the edge of the pressure chamber, and takes the minimal value at the center position between two pressure chambers.

There is such an advantage that in the vicinity of the edge of the pressure chamber, that is, at the maximal value of the curve, the amount of volume change of the pressure chamber increases when the grooves are formed. On the other hand, however, the slope of the curve also changes sharply there. In such places, therefore, when the two grooves on the two sides of the pressure chamber deviate in the same direction by the same amount, the increase and decrease in the amount of volume change of the pressure chamber, caused by each of the two grooves, cannot cancel out each other. Hence, the positional deviation of the grooves alters the amount of volume change to affect the speed of jetting the liquid from the nozzle, thereby leading to variation in the jet speed among the plurality of nozzles. On the other hand, if the grooves are positioned away from the edge of the pressure chamber (close to the center position of two pressure chambers), then there is a small increase in the amount of volume change of the pressure chamber because of forming the grooves, thereby reducing the significance of forming the grooves.

According to the present teaching, the positions X of the grooves with respect to each pressure chamber fall within a deviational range of a predetermined length ($\pm 20$ μm) from the range ($0.2Xc \leq X \leq 0.6Xc$) including an inflection point between the maximal value and the minimal value of the above curve. In the range of $0.2Xc \leq X \leq 0.6Xc$, the curve has a small change in slope, and thus there is an almost linear relationship between the positions of the grooves and the amount of volume change of the pressure chamber. Therefore, even if the pairs of two grooves differ in position among the plurality of pressure chambers, as far as the positions X of those grooves fall within the range of $0.2Xc \leq X \leq 0.6Xc$, the increase in the amount of volume change because one of the two grooves comes close to the edge of the pressure chamber still cancels out the decrease in the amount of volume change because the other of the two grooves moves away from the edge of the pressure chamber. Hence, there is a small variation in the amount of volume change among the plurality of pressure chambers. Further, even if the positions X of the grooves deviate from the above range of $0.2Xc \leq X \leq 0.6Xc$, as far as the deviational length falls within $\pm 20$ μm, then there is still a lower variation than a certain degree in the volume change among the plurality of pressure chambers such that the variation in the jet speed of the plurality of nozzles falls within an allowable range.

According to a second aspect of the present teaching, there is provided a method for manufacturing a liquid discharge apparatus which includes:

a channel structure in which liquid channels are formed to include a plurality of nozzles aligned in an array direction, and a plurality of pressure chambers communicating with the plurality of nozzles respectively and aligned in the array direction; and a piezoelectric actuator including a piezoelectric layer arranged on the channel structure to cover the plurality of pressure chambers, the method comprising:

forming two grooves in the piezoelectric layer to locate on two sides of each pressure chamber in the array direction, and to extend respectively in an orthogonal direction orthogonal to the array direction, for each of the plurality of pressure chambers such that among the plurality of pressure chambers, there is an equal separation distance between the two grooves, wherein when letting X be positions of the grooves from an edge of the pressure chamber according to the array direction, and letting Xc be a center position between the edge of the pressure chamber to the edge of an adjacent other pressure chamber according to the array direction, a target formation positions Xm for the grooves are set to a value within the range of $0.2Xc \leq Xm \leq 0.6Xc$ to form the grooves.

Each groove is formed after setting the target formation positions Xm for the grooves to each pressure chamber to a value within the range ($0.2Xc \leq Xm \leq 0.6Xc$) including the inflection point between the maximal value and the minimal value of the above curve. As stated earlier, the positions of the actually formed grooves to the pressure chamber may deviate from the target positions. However, by setting the target formation positions Xm for the grooves to a value within the above range where the above curve becomes almost linear, if the two grooves deviate from the set positions in the same direction by the same amount, then between the two grooves, the increase and decrease in the amount of volume change of the pressure chamber cancel out each other. Hence, even if the positions of the grooves corresponding to a certain pressure chamber deviate a little from the target formation positions, that pressure chamber still has almost the same amount of volume change as other pressure chambers. Thus, there is also a small variation in the jet speed among the plurality of nozzles.

According to a third aspect of the present teaching, there is provided a liquid discharge apparatus configured to discharge liquid, including:

a channel structure in which liquid channels are formed to include a plurality of nozzles and a plurality of pressure chambers communicating with the plurality of nozzles respectively; and a piezoelectric actuator provided on the channel structure, wherein the piezoelectric actuator includes a piezoelectric layer arranged to cover the plurality of pressure chambers, a plurality of individual electrodes provided on the piezoelectric layer to face the plurality of pressure chambers respectively, a common electrode arranged on the opposite side from the plurality of individual electrodes across the piezoelectric layer to face the plurality of individual electrodes, and a plurality of grooves formed respectively in a portion of the piezoelectric layer around each of the plurality of pressure chambers; and wherein two grooves included in the plurality of grooves differ in position or shape according to a parameter related to a jet speed of the liquid from the corresponding nozzle.

If grooves are formed in a portion of the piezoelectric layer around any pressure chamber, then the piezoelectric layer deforms more in the portion facing that pressure chamber, thereby increasing the amount of volume change of the pressure chamber. Therefore, it is possible to raise the speed of jetting the liquid from the nozzle.

Further, among the plurality of grooves formed respectively in the surrounding portion around each of the plurality of pressure chambers, at least two grooves have different positions or shapes according to the parameter related to the liquid jet speed from the corresponding nozzle. That is, even if variation arises in the liquid jet speed among the plurality of nozzles, because the jet speed is corrected by the different positions or shapes of the at least two grooves, it is still possible to keep the variation low in the jet speed among the plurality of nozzles.

According to a fourth aspect of the present teaching, there is provided a liquid discharge apparatus configured to discharge liquid, including:

a plurality of liquid jet units, wherein each of the liquid jet units includes: a channel structure in which liquid channels are formed to include a plurality of nozzles and a plurality of pressure chambers communicating with the plurality of nozzles, and a piezoelectric actuator provided on the channel structure;

wherein the piezoelectric actuator includes a piezoelectric layer arranged to cover the plurality of pressure chambers, a plurality of individual electrodes provided on the piezoelectric layer to face the plurality of pressure chambers respectively, a common electrode arranged on the opposite side from the plurality of individual electrodes across the piezoelectric layer to face the plurality of individual electrodes, and a plurality of grooves formed respectively in a portion of the piezoelectric layer around each of the plurality of pressure chambers; and wherein among the plurality of liquid jet units, the grooves of the piezoelectric layer differ in position or shape according to a parameter related to a jet speed of the liquid from the corresponding nozzle.

The liquid discharge apparatus of the present teaching includes a plurality of liquid jet units. Further, among the plurality of liquid jet units, the grooves of the piezoelectric actuators have different positions or shapes according to the parameter related to the liquid jet speed from the nozzles. That is, among the plurality of liquid jet units, even if variation arises in the liquid jet speed from the nozzles, because the jet speed is corrected by the different positions or shapes of the grooves among the plurality of liquid jet units, it is still possible to keep the variation low in the jet speed among the plurality of liquid jet units.

According to a fifth aspect of the present teaching, there is provided a method for manufacturing a liquid discharge apparatus which includes:

a channel structure in which liquid channels are formed to include a plurality of nozzles and a plurality of pressure chambers communicating with the plurality of nozzles respectively; and a piezoelectric actuator provided on the channel structure, wherein the piezoelectric actuator includes a piezoelectric layer arranged on the channel structure to cover the plurality of pressure chambers, a plurality of individual electrodes provided on the piezoelectric layer to face the plurality of pressure chambers respectively, a common electrode arranged on the opposite side from the plurality of individual electrodes across the piezoelectric layer to face the plurality of individual electrodes, and a plurality of grooves formed respectively in a portion of the piezoelectric layer around each of the plurality of pressure chambers, the method including:

determining a groove formation condition related to position or shape of the grooves corresponding to the pressure chambers communicating with the nozzles, based on a parameter related to a jet speed of the liquid from each of the nozzles; and forming each of the plurality of grooves in the portion of the piezoelectric layer around each of the plurality of pressure chambers, based on the determined groove formation condition.

According to the present teaching, the formation condition is adjusted for forming the grooves around any pressure chamber in communication with the nozzle on the basis of the parameter related to the jet speed for each nozzle. Therefore, even if variation arises in the liquid jet speed among the plurality of nozzles, by adjusting the formation condition for forming the grooves around the pressure chamber according to the variation in the jet speed, it is still possible to reduce the variation in the jet speed among the plurality of nozzles.

BRIEF DESCRIPTION OF THE DRAWINGS

FIG. 13 is a partially enlarged plan view of an ink jet head according to a modification of a second embodiment of the present teaching;

DESCRIPTION OF THE EMBODIMENTS

Next, an explanation will be made on the common part of embodiments (a first embodiment and a second embodiment) of the present teaching. First, referring to FIG. 1, a schematic configuration of an ink jet printer 1 will be explained. Further, hereinbelow, the near side of the page of FIG. 1 is defined as "upper side" or "upside", while the far side of the page is defined as "lower side" or "downside".

Schematic Configuration of the Printer

Figure 1:
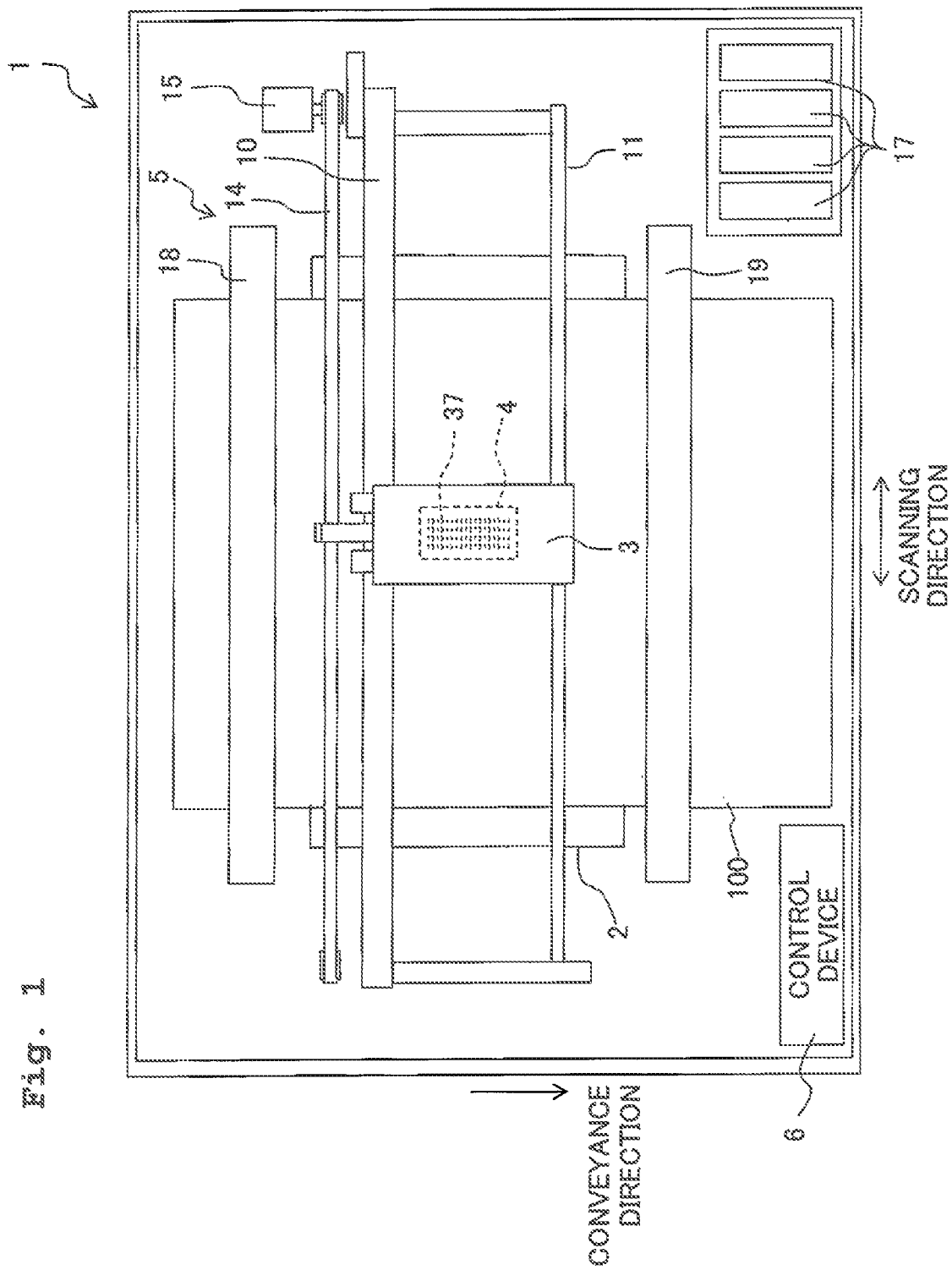
FIG. 1 is a schematic plan view of an ink jet printer according to an embodiment of the present teaching.

As depicted in FIG. 1, the ink jet printer 1 includes a platen 2, a carriage 3, an ink jet head 4, a conveyance mechanism 5, a controller 6, etc.

On the upper surface of the platen 2, there is positioned a sheet of recording paper 100 which is a recording medium. The carriage 3 is configured to move reciprocatingly in a scanning direction along two guide rails 10 and 11 in a region facing the platen 2. An endless belt 14 is connected to the carriage 3; thus, when a carriage drive motor 15 drives the endless belt 14, the carriage 3 moves in the scanning direction.

The ink jet head 4 is fitted on the carriage 3 to move together with the carriage 3 in the scanning direction. The ink jet head 4 is connected through unshown tubes with an ink cartridge 17 for inks of four colors (black, yellow, cyan, and magenta, for example) installed in the ink jet printer 1. A plurality of nozzles 34 are formed in the lower surface (the surface on the far side of the page of FIG. 1) of the ink jet head 4. Further, the ink jet head 4 is configured to jet the four color inks supplied from the ink cartridge 17, from the plurality of nozzles 34 to the recording paper 100 positioned on the platen 2.

The conveyance mechanism 5 has two conveyance rollers 18 and 19 arranged to interpose the platen 2 therebetween in a conveyance direction orthogonal to the scanning direction. The conveyance mechanism 5 uses the two conveyance rollers 18 and 19 to convey the recording paper 100 positioned on the platen 2 in the conveyance direction.

The controller 6 includes a ROM (Read Only Memory), a RAM (Random Access Memory), an ASIC (Application Specific Integrated Circuit) including various control circuits, and the like. Subject to a program stored in the ROM, the controller 6 carries out various processes such as printing on the recording paper 100 with the ASIC. For example, in a printing process, based on a print command entered from an external device such as a personal computer or the like, the controller 6 controls the ink jet head 4, the carriage drive motor 15, etc., to print images and the like on the recording paper 100, in particular, the controller 6 alternately carries out an ink jet operation to jet the inks while moving the ink jet head 4 together with the carriage 3 in the scanning direction, and a conveyance operation to cause the conveyance rollers 18 and 19 to convey the recording paper 100 in the conveyance direction by a predetermined length.

<Ink Jet Head>

FIGS. 4 to 6, FIG. 10, and FIGS. 14 to 16 depict the inks filling the inside of a channel unit 20 of the ink jet head 4 by way of the letter "I". The ink jet head 4 of this embodiments includes the channel unit 20 and a piezoelectric actuator 21.

<Configuration of the Channel Unit>

Figure 4:
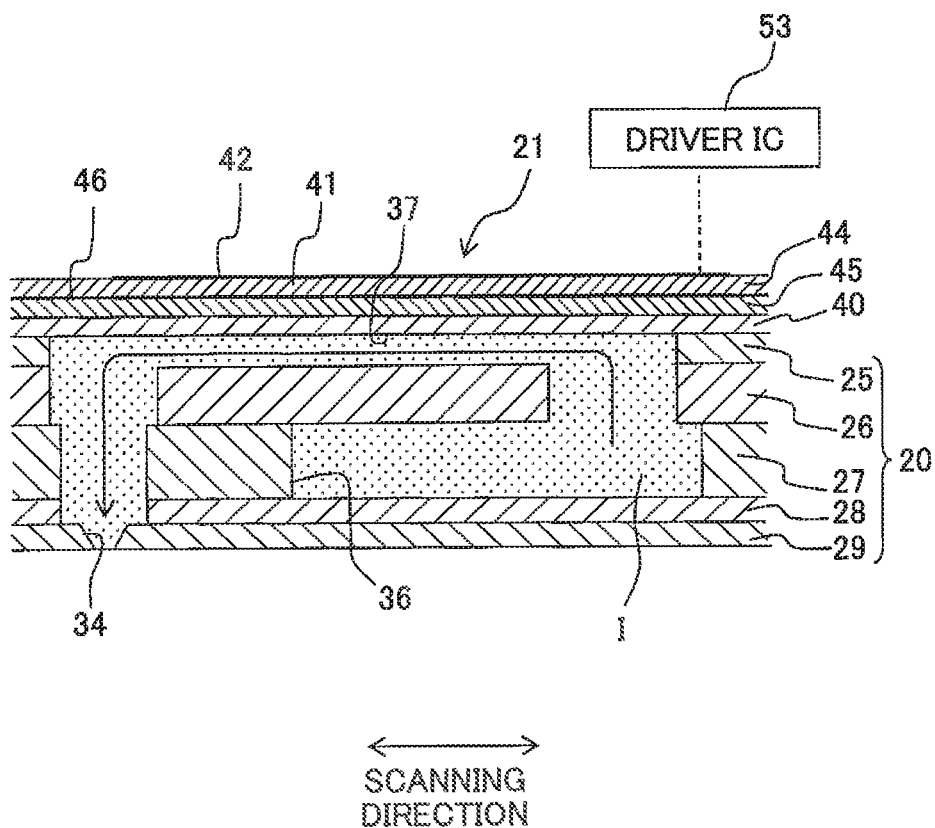
FIG. 4 is a cross-sectional view along the line IV-IV of FIG. 3.
Figure 5:
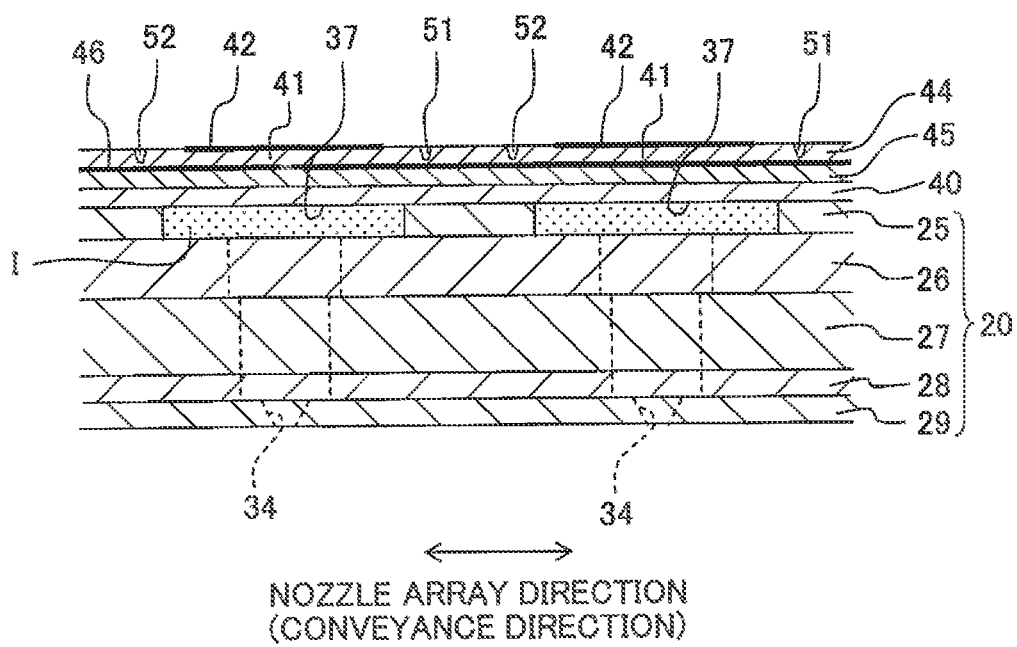
FIG. 5 is a cross-sectional view along the line V-V of FIG. 3.

As depicted in FIGS. 4 and 5, the channel unit 20 has a structure of five stacked plates 25 to 29. Among the five plates 25 to 29, the lowermost-layer plate 29 is the nozzle plate in which the plurality of nozzles 34 are formed. On the other hand, in the other four upper-layer plates 25 to 28, there are formed ink channels such as manifolds 36, pressure chambers 37 and the like in respective communication with the plurality of nozzles 34.

Figure 2:
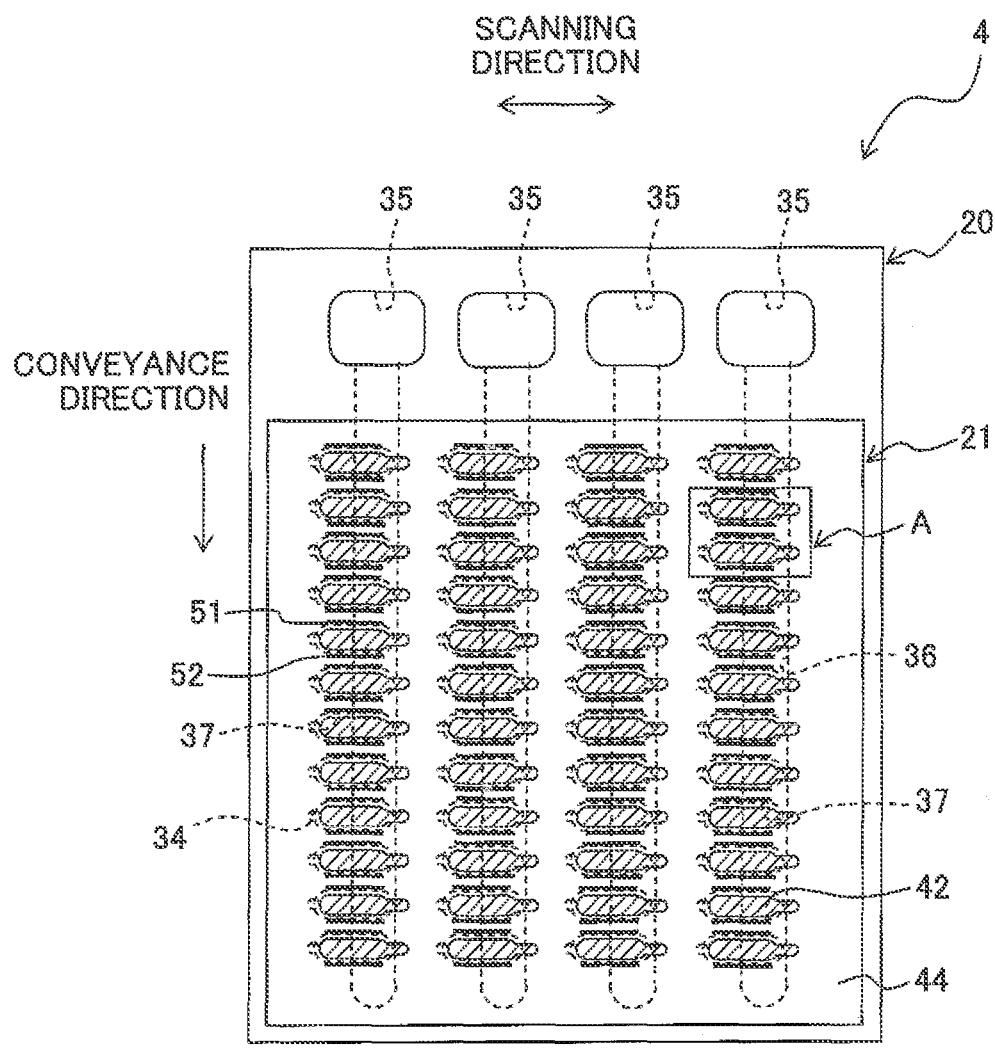
FIG. 2 is a plan view of an ink jet head.

As depicted in FIG. 2, in the upper surface of the channel unit 20, four ink supply ports 35 are formed to align in the scanning direction. Further, the channel unit 20 internally has the four manifolds 36 respectively extending in the conveyance direction. The four manifolds 36 are connected to the four ink supply ports 35.

Figure 3:
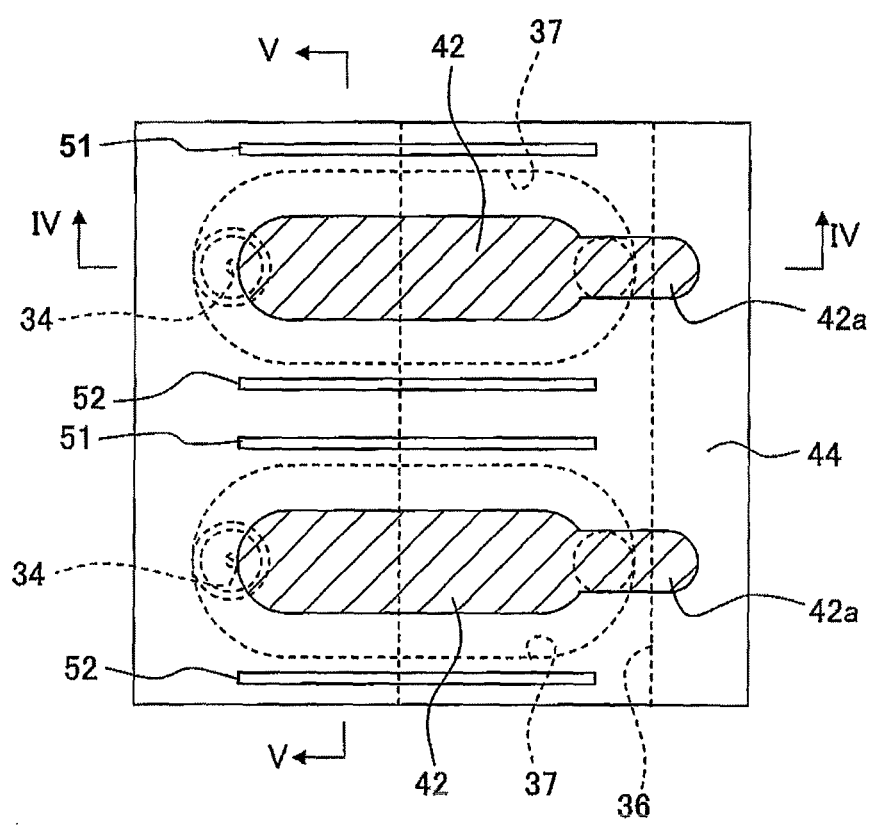
FIG. 3 is an enlarged view of part A of FIG. 2.

Further, the channel unit 20 has the plurality of nozzles 34 opening at the lower surface of the channel unit 20, and the plurality of pressure chambers 37 arranged in the upper surface of the channel unit 20. As depicted in FIG. 3, the plurality of nozzles 34 are arrayed along the four manifolds 36 in the conveyance direction to form four nozzle rows. In the same manner as the nozzles 34, the plurality of pressure chambers 37 are also arrayed along the four manifolds 36 in the conveyance direction to form four pressure chamber rows. Further, each of the pressure chambers 37 has an approximately elliptical shape elongated in the scanning direction. Further, in the following explanation, the term "nozzle array direction" will also be used to refer to such a direction parallel to the conveyance direction as in that the plurality of nozzles 34 and the plurality of pressure chambers 37 are arrayed.

As depicted in FIG. 3, one end of each of the pressure chambers 37 is communicated with the corresponding manifold 36, and other end each of the pressure chambers 37 is communicated with the corresponding nozzle 34. Then, as depicted in FIG. 4 by way of the arrow, inside the channel unit 20, a plurality of individual channels are formed to branch from each of the manifolds 36, pass through the pressure chambers 37, and come down to the nozzles 34.

<Configuration of the Piezoelectric Actuator>

As depicted in FIGS. 3 to 6, the piezoelectric actuator 21 includes an ink sealing film 40, piezoelectric layers 44 and 45, a plurality of individual electrodes 42, and a common electrode 46.

The ink sealing film 40 is attached to the upper surface of the channel unit 20 to cover the plurality of pressure chambers 37. The ink sealing film 40 is formed of a material of low ink permeability, e.g., a metallic material such as stainless steel or the like.

The two piezoelectric layers 44 and 45 are made respectively of a piezoelectric material. As a piezoelectric material to form the piezoelectric layers 44 and 45, it is possible to adopt lead zirconate titanate which is a mixed crystal of lead titanate and lead zirconate. It is also possible to adopt a non-lead piezoelectric material such as barium titanate or a niobium piezoelectric material. The two piezoelectric layers 44 and 45 are stacked on each other and joined on the upper surface of the ink sealing film 40. Each of the piezoelectric layers 44 and 45 has a rectangular shape with the nozzle array direction as its longitudinal direction.

The plurality of individual electrodes 42 are arranged in the nozzle array direction on such an upper surface of the piezoelectric layer 44 as the surface on the opposite side from the piezoelectric layer 45 to correspond respectively to the plurality of pressure chambers. Each of the individual electrodes 42 has an approximately elliptical shape elongated in the scanning direction and sized slightly smaller than the pressure chamber 37, and is arranged to face a central portion of the corresponding pressure chamber 37. A connecting terminal 42a is provided at one longitudinal end of each of the individual electrodes 42. The connecting terminals 42a extend in the scanning direction on the upper surface of the piezoelectric layer 44 from the individual electrodes 42 up to areas not facing the pressure chambers 37.

The plurality of connecting terminals 42a provided respectively to the plurality of individual electrodes 42 are connected with wiring member (not depicted). A driver IC 53 is mounted on this wiring member. Based on a jet control signal from the controller 6, the driver IC 53 switches the potential of each individual electrode 42 between a predetermined drive potential and a ground potential.

The common electrode 46 is arranged almost throughout between the two piezoelectric layers 44 and 45. The common electrode 46 is arranged on the opposite side from the plurality of individual electrodes 42 across the upper piezoelectric layer 44 to face the respective plurality of individual electrodes 42. The common electrode 46 is in electrical conduction with a connecting terminal (not depicted) arranged on the upper surface of the piezoelectric layer 44. Further, the common electrode 46 is connected with a ground wire formed in the wiring member via the connecting terminal, and constantly maintained at the ground potential.

Further, an active portion 41 is particularly defined to refer to a portion of the piezoelectric layer 44 between the individual electrodes 42 and the common electrode 46 as depicted in FIG. 4. The active portion 41 is polarized downward in a thickness direction, that is, in the direction from the individual electrodes 42 toward the common electrode 46.

Figure 6:
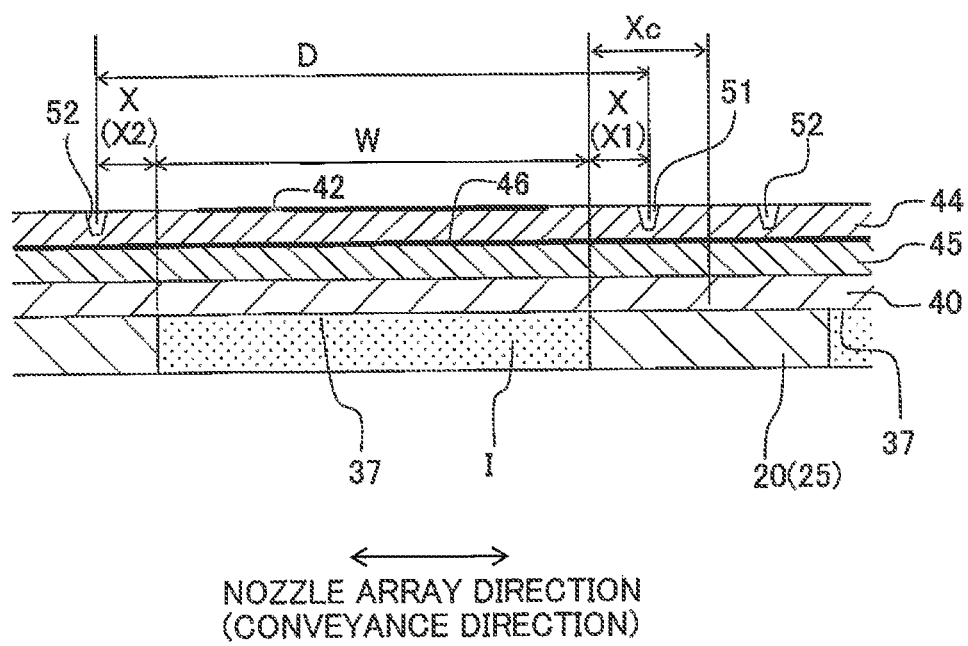
FIG. 6 is a partially enlarged view of FIG. 5.

As depicted in FIGS. 3, 5 and 6, two grooves 51 and 52 are formed in a portion of the upper piezoelectric layer 44 around each pressure chamber 37. The two grooves 51 and 52 extend respectively in the scanning direction in the areas of the upper surface of the piezoelectric layer 44 on both sides of the pressure chamber 37 according to the nozzle array direction. In this manner, by forming the grooves 51 and 52 respectively in the portion of the piezoelectric layer 44 on both sides of each pressure chamber 37, deformation is facilitated in the portion of the piezoelectric layer 44 facing the pressure chamber 37.

<First Embodiment>

As depicted in FIGS. 5 and 6, the two grooves 51 and 52 are formed in symmetrical positions with respect to the pressure chamber 37 according to the nozzle array direction (in a short-length direction of the pressure chamber 37). Further, in FIGS. 5 and 6, while the two grooves 51 and 52 are formed only in the piezoelectric layer 44, the grooves 51 and 52 may also be formed deeply down to the lower piezoelectric layer 45. Further, a separate distance D between any two grooves 51 and 52 in the nozzle array direction is equal to one another. However, as will be explained later, there may be positional deviation between the pressure chamber 37 and the two grooves 51 and 52 and, if so, the two grooves 51 and 52 deviate respectively from the symmetrical positions with respect to the pressure chamber 37. Further, even when two grooves 51 and 52 are formed for a. certain pressure chamber 37 in positions deviated from predetermined target formation positions and there is positional variation of the grooves 51 and 52 with respect to the pressure chamber 37 among the plurality of pressure chambers 37, a positional range is defined for actually locating the grooves 51 and 52 such that the positional variation of the grooves 51 and 52 may less affect the amount of deformation of the piezoelectric layer 44.

In particular, let X be the positions of the grooves 51 and 52 from the edge of the pressure chamber 37 in the nozzle array direction, and Xc be the center position of the interval from the edge of the pressure chamber 37 to the edge of another adjacent pressure chamber 37. The positions X of the grooves 51 and 52 fall within the range of $0.2Xc-20$ μm$\leq X \leq 0.6Xc+20$ μm, respectively. Further, while the grooves 51 and 52 have a predetermined width respectively according to the nozzle array direction, the above "groove position X" refers to the position from the edge of the pressure chamber 37 to the center of each of the grooves 51 and 52 in the nozzle array direction.

Further, for using another expression to explain the above configuration, let W be the width of the pressure chamber 37 according to the nozzle array direction, X1 be the position X of the groove 51 from the edge of the pressure chamber 37, and X2 be the position X of the groove 52 from the edge of the pressure chamber 37. Then, it follows that while constantly maintaining such a relation as $X1+X2=D-W$, X1 and X2 fail within the range of the above $0.2Xc-20$ μm$\leq X \leq 0.6Xc+20$ μm. That is, when the groove 51 on one side is positioned away from the edge of the pressure chamber 37, the groove 52 on the other side is positioned close to the edge of the pressure chamber 37, such that the separate distance D between the grooves 51 and 52 does not change. An explanation will be made later on details of how the grooves 51 and 52 are positioned within the above range.

A description will be made as follows on an operation of the piezoelectric actuator 21 explained above for jetting the inks from the nozzles 34. Suppose that the driver IC 53 has switched the potential of a certain individual electrode 42 from the ground potential to the drive potential. At this time, a potential difference arises between the individual electrode 42, and the common electrode 46 maintained at the ground potential. By virtue of this, an electric field is generated in the active portion 41 of the piezoelectric layer 44 in the thickness direction of the piezoelectric layer 44. Further, in order for the active portion 41 to have a consistent polarization direction with the direction of the electric field, the active portion 41 contracts in the planar direction thereof, and extends in the thickness direction which is the polarization direction. Along with the contractive deformation of the active portion 41, the two piezoelectric layers 44 and 45 bend to project toward the pressure chamber 37. By virtue of this, the pressure chamber 37 decreases in volume to apply a pressure to the internal ink, thereby jetting ink drops from the nozzle 34 in communication with the pressure chamber 37.

Next, a process of manufacturing the ink jet head 4 will be explained. Hereinbelow, the explanation will be made in the order of a process of manufacturing the channel unit 20, and a process of manufacturing the piezoelectric actuator 21.

<1> Manufacturing the Channel Unit

Among the five plates constituting the channel unit 20, the four upper metallic plates 25 to 28 are etched respectively to form channel holes such as the respective pressure chambers 37, manifolds 36, and the like. Further, by laser processing or the like, the plurality of nozzles 34 are formed in the nozzle plate 29. Then, the five plates are superimposed and joined together with an adhesive.

Figure 7A:
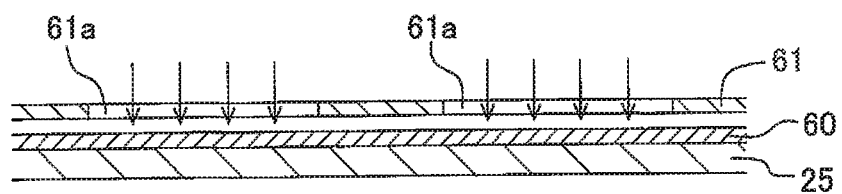
FIGS. 7A to 7C depict a pressure chamber formation process.
Figure 7B:
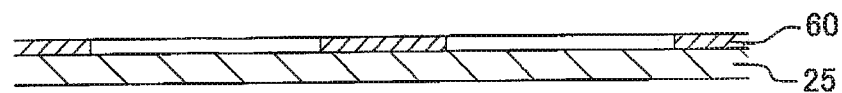
Figure 7C:
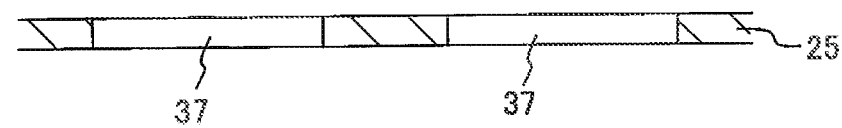

Here, a supplemental explanation will be made on forming the plurality of pressure chambers 37 by etching the plate 25. FIGS. 7A to 7C views for explaining a pressure chamber formation process. As depicted in FIG. 7A, first, a resist film 60 is formed on a surface of the metallic plate 25. Next, as depicted in FIG. 7B, after placing a mask 61 on the resist film 60, the resist film 60 is exposed in the areas for respectively forming the plurality of pressure chambers 37 of the plate 25, and the exposed portions are dissolved with a lysate and then removed. Thereafter, as depicted in FIG. 7C, an etchant is caused to contact with the areas of the plate 25 where the resist film 60 is removed, so as to form the plurality of pressure chambers 37 in the plate 25 by way of wet etching.

<2> Manufacturing the Piezoelectric Actuator

Figure 8A:
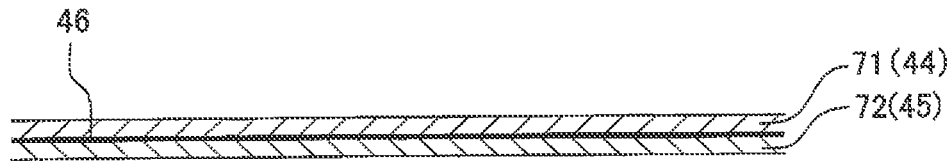
FIGS. 8A to 8D depict a piezoelectric actuator manufacturing process.
Figure 8B:
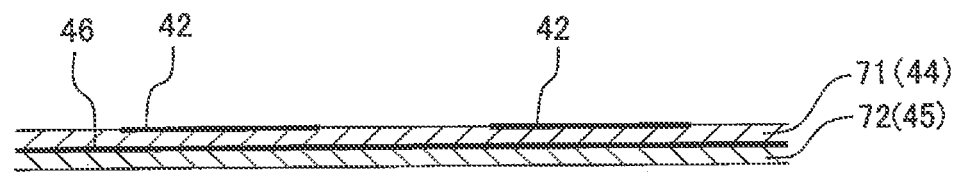

FIGS. 8A to 8B depict a process of manufacturing the piezoelectric actuator 21.

<Common Electrode Formation Process>

As depicted in FIG. 8A, the common electrode 46 is formed on one surface of a not-yet-calcined green sheet 72 which will become the lower piezoelectric layer 45. It is possible to form the common electrode 46 by a publicly known method such as screen printing, vapor deposition, CVD, or the like.

<Stacking Process and Calcining Process>

Next, another not-yet-calcined green sheet 71, which will become the upper piezoelectric layer 44, is stacked over the green sheet 72 to sandwich the common electrode 46. Thereafter, the two stacked green sheets 71 and 72 are calcined at a predetermined temperature to attain a layered body of the piezoelectric layers 44 and 45.

<Individual Electrode Formation Process>

Next, as depicted in FIG. 8B, the plurality of individual electrodes 42 are formed respectively on the upper surface of the piezoelectric layer 44 in the areas which will face the plurality of pressure chambers 37 respectively. It is also possible to form the individual electrodes 42 by a known method such as screen printing, vapor deposition, CVD, or the like. Further, the plurality of individual electrodes 42 may also be, in the same manner as the common electrode 46, formed on the green sheet 71 before calcining the piezoelectric layers 44 and 45.

<Groove Formation Process>

Figure 8C:
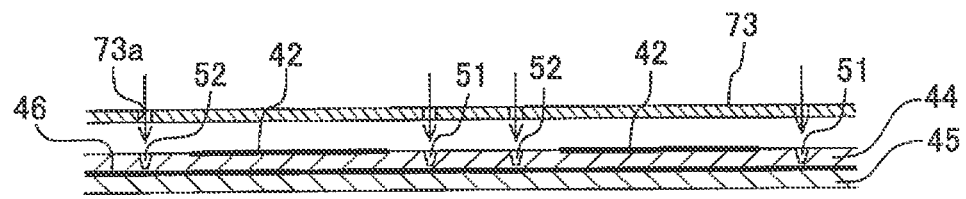

Next, as depicted in FIG. 8C, the two grooves 51 and 52 are formed in the upper surface of the piezoelectric layer 44 for each of the plurality of pressure chambers 37 with reference to the individual electrode 42 by laser processing using a picosecond laser or the like. In particular, first, such a mask 73 is arranged over the upper surface of the piezoelectric layer 44 as to have a plurality of holes 73a corresponding respectively to the plurality of grooves 51 and 52. Any two holes 73a for forming two grooves 51 and 52 are separate by the length D in the nozzle array direction. By radiating the laser light from above the mask 73, each pair of two grooves 51 and 52 is formed in the upper surface of the piezoelectric layer 44 to be separate by the distance D across the individual electrode 42 in the nozzle array direction. Further, the grooves 51 and 52 may also be formed by other methods than using the above mask 73 such as using a galvanic scanner to scan with the laser light.

<Junction Process>

Figure 8D:
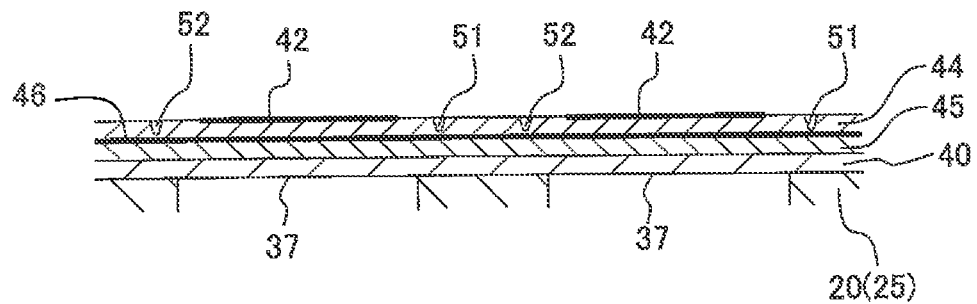

As depicted in FIG. 8D, the ink sealing film 40 is attached onto the upper surface of the channel unit 20 with an adhesive. Further, the ink sealing film 40 need not be necessarily attached at this stage, but may be done at the same time of joining the plates 25 to 29 in manufacturing the channel unit 20. Further, obtained in the processes of FIGS. 8A to 8C and formed thereon with the individual electrodes 42 and common electrode 46, the two piezoelectric layers 44 and 45 are joined onto the upper surface of the ink sealing film 40 with an adhesive after being aligned with the channel unit 20.

However, with the piezoelectric actuator 21 joined on the channel unit 20, there may be positional variation of the grooves 51 and 52 with respect to a pressure chamber 37 among the plurality of pressure chambers 37. As the reasons, when the plurality of pressure chambers 37 are formed in the plate 25, the followings are conceivable: (i) some pressure chambers 37 are arrayed at abnormal intervals or pitches, or (ii) some pressure chambers 37 have different sizes from other pressure chambers 37, etc.

In the example of FIGS. 7A to 7C, as a factor for the above reason (i), such an aspect can be presented that the mask 61 used to expose the resist film 60 undergoes thermal expansion or thermal contraction whereby holes 61a of the mask 61 undergo positional deviation to cause the pressure chambers 37 to deviate out of position. Further, as a factor for the above reason (ii), such an aspect can be presented that due to variation in the concentration and/or temperature of the etchant used in the wet etching, variation arises in the etching speed among the plurality of pressure chambers 37 to cause variation in their size.

Due to the variation in the arrayal pitch for the pressure chambers 37 as stated in the reason (i) and the variation in the size of the pressure chambers 37 as stated in the reason (ii), the grooves 51 and 52 are deviated from the position X from the edge of some pressure chambers 37. For example, if the pressure chambers 37 have a width W (see FIG. 6)=340 µm in the short-length direction, then the maximal amount of variation A in the arrayal pitch for the pressure chambers 37 in the reason (i) is approximately ±18 µm, while the maximal amount of variation B in the width W according to the short-length direction in the reason (ii) is approximately ±8 µm. In this case, if the method of least squares of the maximal amount of variations arising from the respective factors in the reasons (i) and (ii) is used to define the maximal amount of deviation $\Delta X$ from the target formation position for the positions X of the grooves 51 and 52 from the edge of the pressure chambers 37 in the nozzle array direction, then because $\Delta X^2 = A^2 + B^2$, $\Delta X$ is approximately 20 µm. It follows that the actual positions of the grooves 51 and 52 with respect to the pressure chambers 37 may possibly deviate by approximately 20 µm to the maximum extent from the target formation position for the pressure chambers 37.

Further, the above maximal amount of variation A in the arrayal pitch for the pressure chambers 37 depends on the length of the plate 25 (the arrayal number of pressure chambers 37) in the conveyance direction. If the length of the plate 25 in the conveyance direction is approximately 35 mm, then the maximal amount of variation A is approximately ±18 µm as described above. The shorter the plate 25, the smaller the value of A. Further, the maximal amount of variation B in the width W of the pressure chambers 37 does not so depend on the width of the pressure chambers 37, and is thus approximately ±8 µm. This is conceivably because the variation in the width W of the pressure chambers 37 is dominated by the variation amount from the ridge line of the mask 61 in forming the pressure chambers 37 by etching.

However, as will be explained next, even though the grooves 51 and 52 deviate out of position with respect to the pressure chambers 37, if the positions X of the grooves 51 and 52 fall within a predetermined range explained below, then there is a smaller variation in the amount of volume change among the plurality of pressure chambers 37, thereby less effecting the speed of jetting the inks from the nozzles 34.

Figure 9:
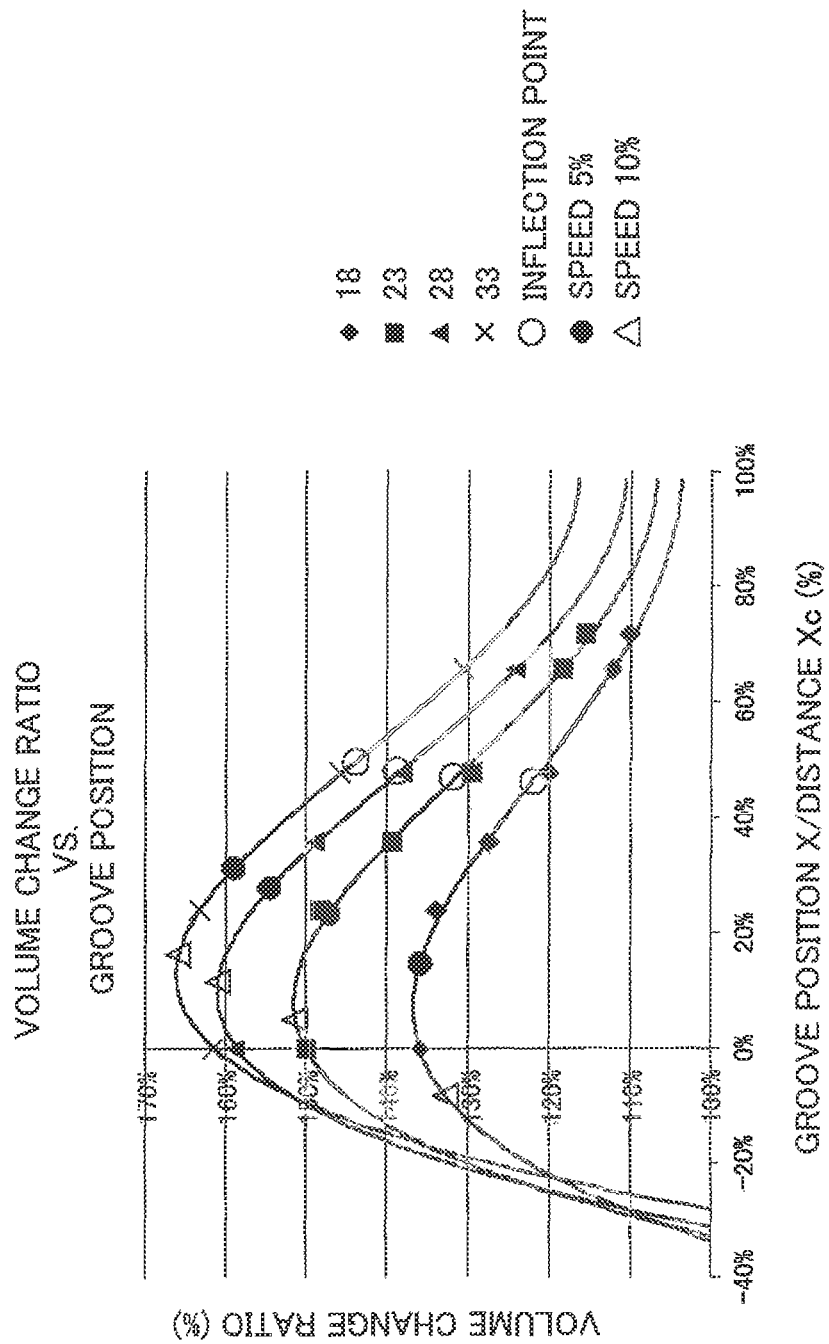
FIG. 9 is a graph showing a relationship between the position of grooves and the amount of volume change of pressure chamber.

FIG. 9 is a graph showing a relationship between the position of the grooves 51 and 52 and the amount of volume change of the pressure chamber 37. The horizontal axis of FIG. 9 represents in percentage the dimensionless value (X/Xc) of the groove position X divided by the distance Xc. Further, "volume change ratio" on the vertical axis of FIG. 9 represents in percentage the ratio of the amount of volume change of the pressure chamber 37 with the grooves 51 and 52 formed, to the amount of volume change without the grooves 51 and 52 formed. Further, FIG. 9 plots, by multiple points, the amount of volume change of the pressure chamber 37 when the grooves 51 and 52 are changed in position with respect to the pressure chamber 37, and then approximates those multiple points by quartic curves.

Further, FIG. 9 depicts a result of considering the depth of the grooves 51 and 52 by four different models. The primary conditions for those models are as follows,
(Material of the piezoelectric layers 44 and 45): Lead zirconate titanate (PZT)
(Thickness of the piezoelectric layers 44 and 45): 18 µm
(Width of the pressure chambers 37 in the nozzle array direction): 340 µm
(Depth of the grooves): Four types of 18 µm, 23 µm, 28 µm, and 33 µm Further, by those four models, the variation in the jet speed of the nozzles 34 is also considered, and the primary conditions used therefor are as follows.
(Nozzle diameter): 20 µm
(Ink viscosity): 3 Pa·s Each of the four quartic approximate curves of FIG. 9 on the four models takes its maximal value in the vicinity of the edge of the pressure chamber 37 (in the vicinity of 10% of the dimensionless value on the horizontal axis). Further, it takes the minimal value in the vicinity of the center position of the pressure chamber 37 (in the vicinity Of 100% of the dimensionless value on the horizontal axis). Further, each curve has an inflection point at the position shown by the mark "○" between the maximal value and the minimal value. The inflection point on each of the four curves of FIG. 9 is positioned at 46% (the groove depth 18 μm), 47% (the groove depth 23 μm), 48% (the groove depth 28 μm), and 49% (the groove depth 33 μm). However, while being not depicted in FIG. 9, it is understood that as a result of considering various models otherwise and acquiring the approximate curves, the inflection point of an approximate curve indicating a relation between the groove position and the amount of volume change falls within the range from 42% to 55%. Expressed by the positions X of the grooves 51 and 52, the range is $0.42Xc \leq X \leq 0.55Xc$. In the range of the present inflection point, the slope of the curve is almost constant.

However, as stated earlier, the separate distance D is equal to one another between the two grooves 51 and 52 arranged across any pressure chamber 37 among the plurality of pressure chambers 37. Then, when the groove position deviates with respect to the pressure chamber 37 due to the contraction of the piezoelectric layer 44, the two grooves 51 and 52 on both sides of each pressure chamber 37 deviate with respect to the pressure chamber 37 in the same direction by the same amount. On this occasion, if the increase in the amount of volume change of the pressure chamber 37 because the groove 51 (52) on one side comes close to the edge of the pressure chamber 37 cancels out the decrease in the amount of volume change of the pressure chamber 37 because the groove 52 (51) on the other side moves away from the edge of the pressure chamber 37, then the positional variation of the grooves 51 and 52 almost does not affect the speed of jetting the liquid from the nozzles 34.

There is such an advantage that in the vicinity of the edge of the pressure chamber 37, that is, at the maximal value of the curve, the amount of volume change of the pressure chamber 37 increases when the grooves 51 and 52 are formed. On the other hand, however, the slope of the curve also changes sharply there. Therefore, when the two grooves 51 and 52 on both sides of the pressure chamber 37 deviate in the same direction by the same amount, the increase and decrease in the amount of volume change of the pressure chamber 37, caused by each of the two grooves 51 and 52, cannot cancel out each other. Hence, the positional deviation of the grooves 51 and 52 comes to affect the speed of jetting the liquid from the nozzle 34, thereby leading to variation in the jet speed among the plurality of nozzles 34. Further, if the grooves 51 and 52 are positioned away from the edge of the pressure chamber 37 (close to the center position of two pressure chambers 37), then there is a small increase in the amount of volume change of the pressure chamber 37 because of forming the grooves 51 and 52, thereby reducing the significance of forming the grooves 51 and 52 in the piezoelectric layer 44.

The curves of FIG. 9 include inflection points. In the range for the dimensionless value X/Xc to be from 20% to 60%, that is, in the range of $0.2Xc \leq X \leq 0.6Xc$, the curves have a small change in slope, and thus there is an almost linear relationship between the positions of the grooves 51 and 52 and the amount of volume change of the pressure chamber 37. Therefore, between the two grooves 51 and 52 of each pressure chamber 37, if the groove 51 (52) on one side deviates to come close to the edge of the pressure chamber 37, then because of that, the pressure chamber 37 undergoes a larger amount of volume change, whereas because the groove 52 (51) on the other side deviates away from the edge of the pressure chamber 37, the pressure chamber 37 undergoes a smaller amount of volume change. Thus, if the grooves 51 and 52 are positioned within the above range, then because of the almost linear relationship between the positions of the grooves 51 and 52 and the amount of volume change of the pressure chamber 37, the increase in the amount of volume change because the groove 51 (52) on the one side comes close to the edge of the pressure chamber 37 cancels out the decrease in the amount of volume change because the groove 52 (51) on the other side moves away from the edge of the pressure chamber 37.

That is, even though the grooves 51 and 52 deviate out of position among the plurality of pressure chambers 37, if the position X of each of the grooves 51 and 52 falls within the range of $0.2Xc \leq X \leq 0.6Xc$ for the approximate curves to be almost linear, then there is a small variation in the amount of volume change among the plurality of pressure chambers 37. For this reason, there is also a small variation in the jet speed among the plurality of nozzles 34. Hence, it is preferable to set the target formation positions XIII for the grooves 51 and 52 within the range of $0.2Xc \leq Xm \leq 0.6Xc$ in forming the grooves 51 and 52 in the piezoelectric layer 44.

However, the positions X of the actually formed grooves 51 and 52 may possibly deviate from the target formation positions Xm and, in such a case, the maximal amount of deviation is approximately ±20 μm as explained earlier. That is, when the target formation positions Xm are set within the range of $0.2Xc \leq Xm \leq 0.6Xc$, the actual positions of the grooves 51 and 52 may exist within the range of $0.2Xc - 20 \mu m \leq X \leq 0.6Xc + 20 \mu m$.

With that, consideration is made on to what extent the jet speed varies when the actual groove positions X deviate by ±20 μm for each target formation position Xm within the range of $0.2Xc \leq Xm \leq 0.6Xc$. The mark "●" in FIG. 9 indicates the target formation position XIII for the variation in the jet speed to be 5% when the actual positions of the grooves 51 and 52 deviate toward the pressure chamber 37 by 20 μm from the target formation position Xm. Further, the mark "Δ" in FIG. 9 indicates the target formation position Xm for the variation in the jet speed to be 10% when the actual positions of the grooves 51 and 52 deviate toward the pressure chamber 37 by 20 μm from the target formation position Xm.

For example, on the curve with the groove depth at 33 mm, the mark "●" indicates that the value on the horizontal axis is 35% (X=0.35Xc). This indicates that when the grooves 51 and 52 are formed with the target formation position Xm=0.35Xc, if the actual groove positions X for a certain pressure chamber 37 deviate toward the pressure chamber 37 by 20 μm from the Xm (=0.35Xc), then the variation in the jet speed becomes 5% in comparison with a pressure chamber 37 for which the grooves 51 and 52 are formed at the target formation position Xm. Further, the mark "Δ" indicates that the value on the horizontal axis is 16% (X=0.16Xc). This indicates that when the grooves 51 and 52 are formed with the target formation position Xm=0.16Xc, if the actual groove positions X for a certain pressure chamber 37 deviate toward the pressure chamber 37 by 20 μm from the Xm(=0.16Xc), then the variation in the jet speed becomes 10%. That is, if Xm is set at 0.35Xc or higher, then even if the positions of the grooves 51 and 52 deviate, the variation in the jet speed can be kept at 5% or lower, while if Xm is set at 0.16Xc or higher, then the variation in the jet speed can be kept at 10% or lower.

Generally; in the field of ink jet, in order to keep image quality from being lowered by variation in the jet speed, it is required to keep the variation in the jet speed at 10% or lower. To this end, if the target formation position Xm is supposedly within the range of 0.2Xc≤Xm≤0.6Xc, then the minimal value 0.2Xc is always on the right side of the mark "Δ" at which the variation in the jet speed is 10% on any curves for the four models. Therefore, even if the actual groove positions X for a certain pressure chamber 37 deviate from the target formation position Xm (=0.2Xc) by 20 μm to be 0.2Xc–20 μm, the variation in the jet speed is still kept at 10% or lower in comparison with a pressure chamber 37 for which the grooves 51 and 52 are formed at the target formation position Xm.

Further, on the side of the pressure chamber 37 where the value of X becomes larger than that in the range of 0.2Xc≤X≤5 0.6Xc, the slope of the curves in FIG. 9 becomes gentler. This means that even if the groove positions X differ, the ratio of volume change almost does not change. For this reason, in FIG. 9, on the (right) side away from the edge of the pressure chamber 37, there are neither the mark "●" indicating the variation in the jet speed at 5% or lower nor the mark "Δ" indicating the variation in the jet speed at 10% or lower. That is, when the target formation position Xm takes the maximal value 0.6Xc, even if the actual positions of the grooves 51 and 52 deviate by 20 μm from Xm (=0.6Xc) to the opposite or farther side from the pressure chamber 37, the variation in the jet speed is still almost not affected.

In the above manner, it is understood that if the actual positions X of the grooves 51 and 52 formed in the piezoelectric layer 44 fall within the range of 0.2Xc−20 μm≤X≤0.6Xc+20 μm which has further added the maximal amount of deviation ±20 μm to the range of the target formation position Xm (0.2Xc≤Xm≤0.6Xc), then the variation in the jet speed is kept at 10% or lower.

Further, from the viewpoint of keeping the jet variation at a low level, it is preferable that the actual positions X of the grooves 51 and 52 fall within the range of 0.2Xc≤X≤0.6Xc where the approximate curves of FIG. 9 are almost linear. Further, in order to keep the variation in the jet speed at a lower level (to keep it at 5% or lower, in particular), it is preferable for the actual positions X to fall within the range of 0.35Xc≤X≤0.6Xc. Further, it is more preferable for them to fall within the range of 0.42Xc≤X≤0.55Xc in the vicinity of the inflection points with almost a constant slope of the curves.

In the first embodiment explained above, the ink jet head 4 corresponds to the liquid discharge apparatus of the present teaching. The channel unit 20 corresponds to the channel structure of the present teaching.

<Modifications of the First Embodiment>

While the first embodiment of the present teaching was explained above, application of the present teaching is not limited to the first embodiment described above but, as exemplified below, may be changed as appropriate without departing from the true spirit and scope of the present teaching.

In the above first embodiment, two grooves 51 and 52 are provided for one pressure chamber 37 on both sides thereof in the short-length direction. However, the two grooves 51 and 52 may be provided for one pressure chamber 37 in the longitudinal direction (in the scanning direction).

In the above first embodiment, as reasons for the grooves 51 and 52 to undergo positional deviation from any pressure chamber 37 among the plurality of pressure chambers 37, the variation in the arrayal pitch for the pressure chambers 37, and the variation in the shape of the pressure chambers 37 are presented. There are also other factors than those for the grooves 51 and 52 to undergo positional deviation from any pressure chamber 37. For example, in FIGS. 8A to 8D for the above first embodiment, the plurality of individual electrodes 42 are formed on the calcined piezoelectric layer 44. However, the plurality of individual electrodes 42 may be formed first on the not-yet-calcined green sheet 71, and then the green sheet 71 may be calcined to become the piezoelectric layer 44. In such cases, because the piezoelectric layer 44 contracts in the calcination, when it is joined to the channel unit 20, the individual electrodes 42 undergo positional deviation from the pressure chambers 37. On top of that, if the grooves 51 and 52 are formed in the piezoelectric layer 44 with reference to the positions of the individual electrodes 42, then the grooves 51 and 52 also undergo positional deviation from the pressure chambers 37.

The configurations of the channel unit and the piezoelectric actuator are not limited to those of the above first embodiment. For example, the number of the piezoelectric layers of the piezoelectric actuator is not limited to two, but can be changed as appropriate. Further, the pressure chambers 37 and the corresponding individual electrodes 42 are not limited to the shapes in the above first embodiment. For example, although arranged on the piezoelectric layer 44 on the opposite side from the pressure chambers 37 in the above first embodiment, the individual electrodes 42 may be arranged on the side to the pressure chambers 37.

<Second Embodiment>

Figure 10:
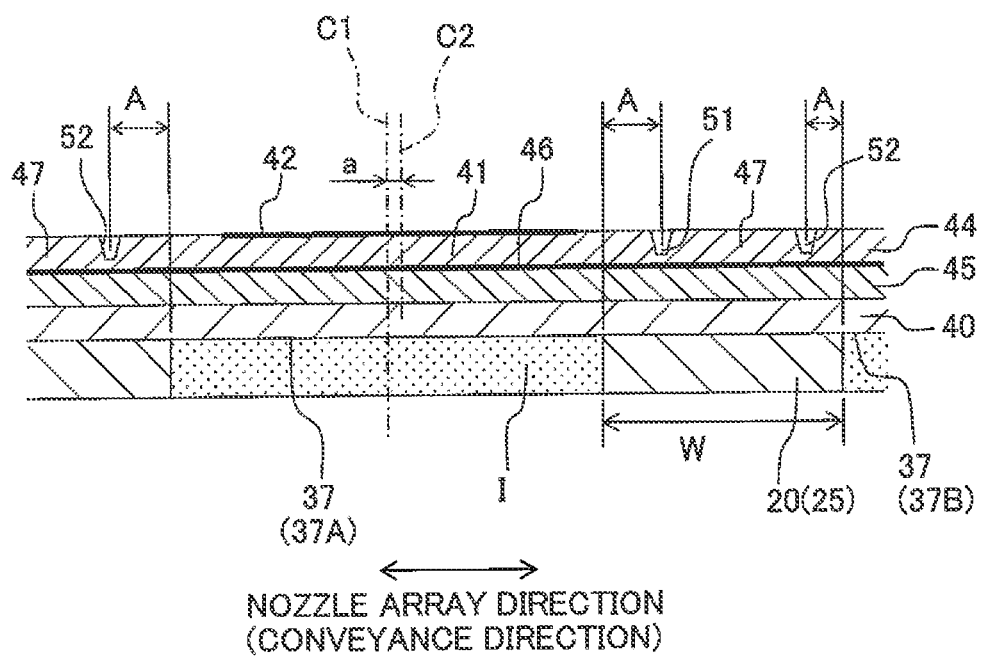
FIG. 10 is a partially enlarged view of FIG. 5 (groove position change)

As depicted in FIGS. 3, 5 and 10, two grooves 51 and 52 are formed in a portion of the upper piezoelectric layer 44 around each pressure chamber 37. The two grooves 51 and 52 extend respectively in the scanning direction in the areas of the upper surface of the piezoelectric layer 44 on both sides of the pressure chamber 37 in the nozzle array direction. Further, in FIGS. 5 and 10, while the two grooves 51 and 52 are formed only in the piezoelectric layer 44, the grooves 51 and 52 may also be formed deeply down to the lower piezoelectric layer 45. In this manner, by forming the grooves 51 and 52 respectively in the portion of the piezoelectric layer 44 on both sides of each pressure chamber 37, deformation is facilitated in the portion of the piezoelectric layer 44 facing the pressure chamber 37. Further, for each pressure chamber 37, the grooves 51 and 52 are provided in pair to locate across that pressure chamber 37. Therefore, as depicted in FIGS. 5 and 10, in a portion 47 of the piezoelectric layer 44 between two adjacent pressure chambers 37 in the nozzle array direction (the portion having a width "W2" in FIG. 10), the groove 51 is firmed close to the left pressure chamber 37 (37A) while the groove 52 is formed dose to the right pressure chamber 37 (37B).

Further, because the grooves 51 and 52 are formed in the portion of the piezoelectric layer 44 around each pressure chamber 37, deformation is facilitated in the portions of the piezoelectric layer 44 facing the pressure chambers 37, thereby increasing the amount of volume change of the pressure chambers 37. Hence, it is possible to raise the speed of jetting the inks from the nozzles 34.

However, in the ink jet head 4 mentioned above, it would be preferable for the jet speed of the inks to be identical from one nozzle 34 to another among the plurality of nozzles 34. In reality, however, there is inevitably variation in the ink jet speed among the plurality of nozzles 34. An example will be given as follows.

If any individual electrode 42 is formed deviating in a planar direction of the piezoelectric layer 44 from the correct position facing a central portion of the pressure chamber 37, then the deformation of the piezoelectric layer 44 will inevitably be reduced in proportion to that for the pressure chamber 37. Therefore, the amount of volume change of that pressure chamber 37 is also reduced so as to lower the speed of jetting the ink from the nozzle 34 in communication with that pressure chamber 37. Further, in forming the plurality of individual electrodes 42 on the piezoelectric layer 44, if a certain individual electrode 42 deviates out of position with respect to the pressure chamber 37, then it may differ in position from other individual electrodes 42.

For example, while details will be explained later in reference to FIGS. 12A to 12C, suppose that the plurality of individual electrodes 42 are formed first on the not-yet-calcined green sheet 71, and then the green sheet 71 is calcined to become the piezoelectric layer 44. Then, the piezoelectric layer 44 contracts from the original green sheet 71 in the planar direction during the calcination. This affects and causes each of the individual electrodes 42 to undergo positional deviation from the corresponding pressure chamber 37. Further, because the amount of contraction differs according to the place of the piezoelectric layer 44 where each of the plurality of individual electrodes 42 is formed, when the piezoelectric actuator 21 is joined to the channel unit 20, the amount of positional deviation of each individual electrode 42 also differs with respect to the corresponding pressure chamber 37 among the plurality of pressure chambers 37.

Other than the above, in forming the plurality of pressure chambers 37 in the plate 25 by way of etching or the like, due to some error during the manufacturing, the plurality of pressure chambers 37 may differ in position and shape. Due to this factor, the amount of positional deviation of each individual electrode 42 differs with respect to the corresponding pressure chamber 37 among the plurality of pressure chambers 37.

In the second embodiment, therefore, in order to reduce the variation in the ink jet speed among the plurality of nozzles 34, the positions of the grooves 51 and 52 are determined for each pressure chamber 37. In particular, as depicted in FIG. 10, positions A of the grooves 51 and 52 corresponding to each pressure chamber 37 from the edge of the pressure chamber 37 in the nozzle array direction are determined according to the amount of positional deviation 'a' between the pressure chamber 37 and the individual electrode 42 in the nozzle array direction and, among the plurality of pressure chambers 37, the positions A of the grooves 51 and 52 are different. In FIG. 10, the grooves 51 and 52 on both sides of the left pressure chamber 37A are located farther away from the edge of the pressure chamber 37 than the grooves 51 and 52 on both sides of the right pressure chamber 37B. Further, between the groove 51 and the groove 52 corresponding to one pressure chamber 37, the positions A have the same value. Therefore, the two grooves 51 and 52 are provided to locate symmetrically with respect to the pressure chamber 37 in the nozzle array direction.

While each of the grooves 51 and 52 has a predetermined width in the nozzle array direction, the above "groove position A" refers to the position from the edge of the pressure chamber 37 to the center of each of the grooves 51 and 52 according to the nozzle array direction. Further, the amount of positional deviation 'a' refers to the deviation amount in the nozzle array direction between a center line C1 of the pressure chamber 37 and a center line C2 of the individual electrode 42. Further, this amount of positional deviation 'a' is "the parameter related to the speed of jetting the liquid from the nozzle" according to the present teaching.

Figure 11:
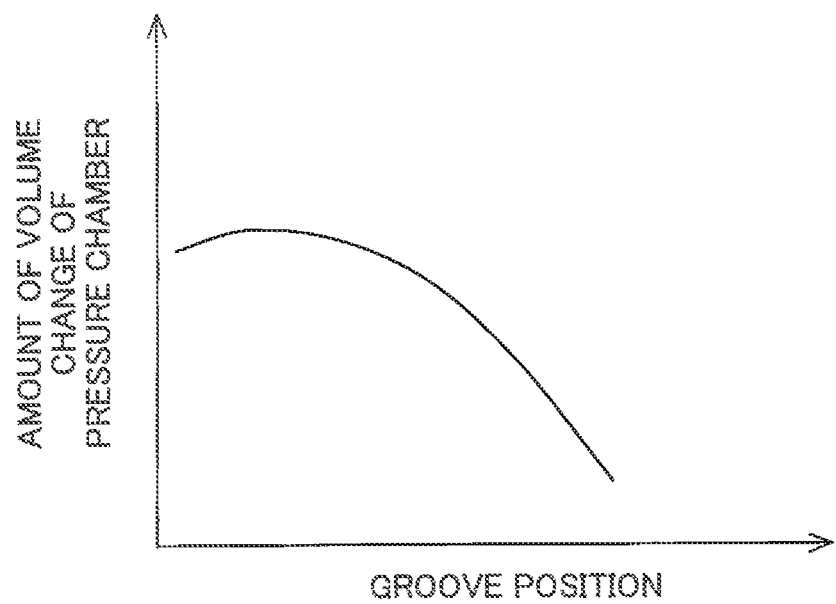
FIG. 11 is a graph showing another relationship between the positions of grooves and the amount of volume change of pressure chamber.

FIG. 11 is a graph depicting a relationship between the groove, position A and the amount of volume change of the pressure chamber 37. The "amount of volume change of the pressure chamber 37" refers to the amount of volume change of the pressure chamber 37 when deformation occurs in the portion of the piezoelectric layer 44 covering the pressure chamber 37, and can also be rephrased as the amount of deformation of the piezoelectric layer 44. As understood from FIG. 11, when the groove 51 (52) is positioned in the vicinity of the edge of the pressure chamber 37, the amount of volume change of the pressure chamber 37 becomes maximal, whereas as the groove 51 (52) is positioned away from the edge of the pressure chamber 37, the amount of volume change of the pressure chamber 37 decreases. In the second embodiment, therefore, the position A of the groove 51 (52) is set to reduce the variation in the amount of volume change among the plurality of pressure chambers 37.

That is, the groove positions A are set to a smaller value for a pressure chamber 37 with a smaller amount of volume change while the individual electrode 42 has a larger amount of positional deviation 'a' with respect to the pressure chamber 37, so as to form the grooves 51 and 52 close to the edge of the pressure chamber 37. On the other hand, the groove positions A are set to a larger value for a pressure chamber 37 with a comparatively larger amount of volume change while the individual electrode 42 has a smaller amount of positional deviation 'a', so as to form the grooves 51 and 52 to locate away from the edge of the pressure chamber 37.

Next, centered primarily around a process of manufacturing the piezoelectric actuator 21, a process of manufacturing the ink jet head 4 will be explained. FIGS. 12A to 12C show the process of manufacturing the ink jet head 4.

<electrode Formation Process>

Figure 12A:
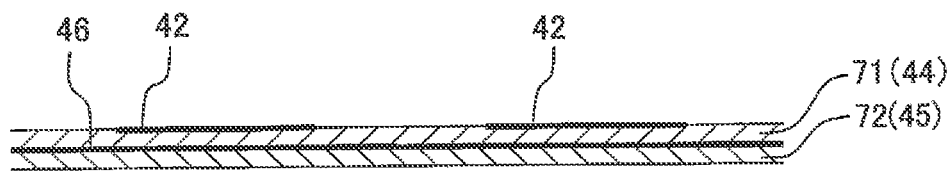
FIGS. 12A to 12C depict a process of manufacturing the ink jet head.
Figure 12B:
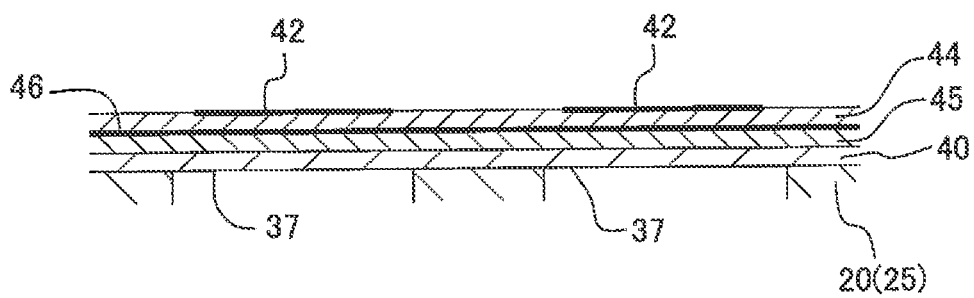

As depicted in FIG. 12A, the individual electrodes 42 are formed on one surface of the not-yet-calcined green sheet 71 which will become the upper piezoelectric layer 44. Further, the common electrode 46 is formed on one surface of the not-yet-calcined green sheet 72 which will become the lower piezoelectric layer 45. It is possible to form the individual electrodes 42 and the common electrode 46 by a publicly known method such as screen printing, vapor deposition, CVD, or the like.

<Stacking Process and Calcining Process>

Next, the two green sheets 71 and 72 are stacked to sandwich the common electrode 46. Thereafter, the two stacked green sheets 71 and 72 are calcined at a predetermined temperature to attain a layered body of the piezoelectric layers 44 and 45. Further, in the above explanation, the plurality of individual electrodes 42 are supposedly formed on the not-yet-calcined green sheet 71. However, it is also possible to form the plurality of individual electrodes 42 by screen printing or the like on the upper surface of the piezoelectric layer 44 after calcining the piezoelectric layers 44 and 45 (the green sheets 71 and 72).

<Junction Process>

Next, the piezoelectric actuator 21 is joined to the channel unit 20. First, as depicted in FIG. 12B, the ink sealing film 40 is attached onto the upper surface of the channel unit 20 with an adhesive. Further, the ink sealing film 40 need not be necessarily attached at this stage, but may be done at the same time of joining the plates 25 to 29 in manufacturing the channel unit 20. Further, obtained in the processes of FIGS. 12A and 12l3 and formed thereon with the individual electrodes 42 and common electrode 46, the two piezoelectric layers 44 and 45 are joined onto the upper surface of the ink sealing film 40 with an adhesive after being aligned with the channel unit 20.

<Process of Measuring the Amount of Positional Deviation>

After the junction process, the amount of positional deviation 'a' is measured for each of the plurality of individual electrodes 42 with respect to the corresponding pressure chamber 37. It is possible to measure, in the following manner for example, the amount of positional deviation 'a' between the individual electrodes 42 formed on the upper surface of the piezoelectric layer 44, and the pressure chambers 37 covered by the piezoelectric layers 44 and 45. First, a reference mark is set and prepared beforehand at a predetermined position uncovered by the piezoelectric layers 44 and 45 on the upper surface of the channel unit 20. Next, after joining the piezoelectric actuator 21 onto the channel unit 20 in the above junction process, the position of each individual electrode 42 is measured with respect to the reference mark of the channel unit 20. Here, in the process of manufacturing the above piezoelectric actuator 21, supposing that there is no change in the position of each pressure chamber 37 with respect to the reference mark of the channel unit 20, it is possible to acquire the amount of positional deviation 'a' of each individual electrode 42 with respect to the pressure chamber 37.

Further, in forming the plurality of pressure chambers 37 in the plate 25, if there is positional deviation among the plurality of pressure chambers 37, then the process is performed in the following manner. In forming the plurality of pressure chambers 37 in the plate 25 by etching, for example, the positional deviation has a certain inclination due to the condition of etching such as the mask used therefor and the like. From the viewpoint of traceability, information related to the inclination is usually recorded beforehand as assembly information. Then, using the assembly information, it is possible to estimate the amount of positional deviation 'a' of each individual electrode 42 with respect to the pressure chamber 37. Further, if for the plurality of pressure chambers 37, a sensor or the like is used to individually measure the amount of positional deviation 'a' between any pressure chamber and the individual electrode, it is possible to acquire the amount of positional deviation 'a' with high precision.

<Groove Formation Process>

Next, referring to the relationship between the groove position A and the amount of volume change of the pressure chamber 37 as depicted in FIG. 11, according to the amount of positional deviation 'a' of the individual electrode 42 with respect to each pressure chamber 37, the groove positions A of the two grooves 51 and 52 are determined to correspond to each pressure chamber 37. The groove positions A correspond to the groove formation condition of the present teaching. Based on the groove positions A determined in this manner, as depicted in FIG. 12C, the two grooves 51 and 52 are formed in the piezoelectric layer 44 for each pressure chamber 37. It is possible to form the grooves 51 and 52 with high precision by adopting, for example, laser processing using a picosecond laser or the like.

As explained above, in the second embodiment, the positions A of the plurality of grooves 51 (52) formed respectively in surrounding portions around the plurality of pressure chambers 37 are determined according to such an amount of positional deviation 'a' of the individual electrode 42 with respect to each pressure chamber 37 as the parameter related to the ink jet speed from the nozzle 34, and the above positions A are different among the plurality of grooves 51 (52). By virtue of this, even when there is variation in the ink jet speed among the plurality of nozzles 34, because the jet speed is corrected by making different positions or shapes of the grooves 51 (52), the variation in the ink jet speed is still kept low among the plurality of nozzles 34.

In the second embodiment explained above, the ink jet head 4 corresponds to the liquid discharge apparatus of the present teaching. The channel unit 20 corresponds to the channel structure of the present teaching.

Next, explanations will be made on several modifications which have applied various changes to the above embodiments. However, the same reference signs are assigned to the components identical or similar in configuration to those in the above embodiments, and any explanation therefor will be omitted as appropriate.

In the above second embodiment, the positions of the plurality of grooves 51 (52) are made different according to such an amount of positional deviation 'a' of the individual electrode 42 with respect to each pressure chamber 37 as the parameter related to the ink jet speed from the nozzle 34. In contrast to this, the shapes of the plurality of grooves 51 (52) may otherwise be made different. For example, the longer the grooves 51 (52), the more the deformation of the piezoelectric layer 44, and thus the more the amount of volume change of the pressure chamber 37. Hence, as depicted in FIG. 13, in order to keep a low variation in the ink jet speed among the plurality of nozzles 34, a groove length B of each groove 51 (52) may be made different among the plurality of pressure chambers 37.

Figure 14:
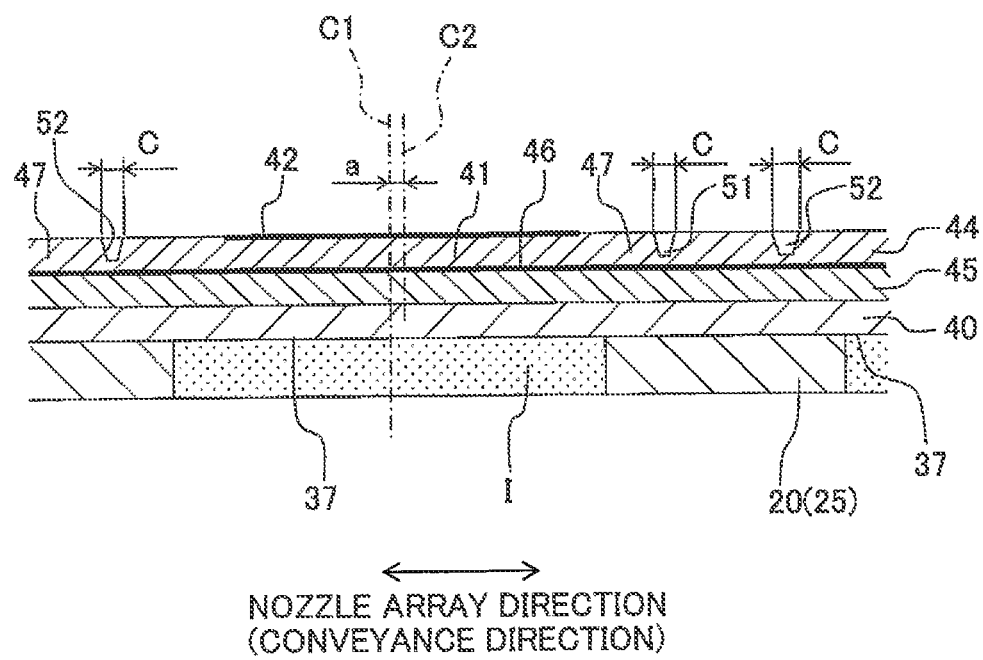
FIG. 14 is a partial cross-sectional view of an ink jet head according to another modification of the second embodiment.
Figure 15:
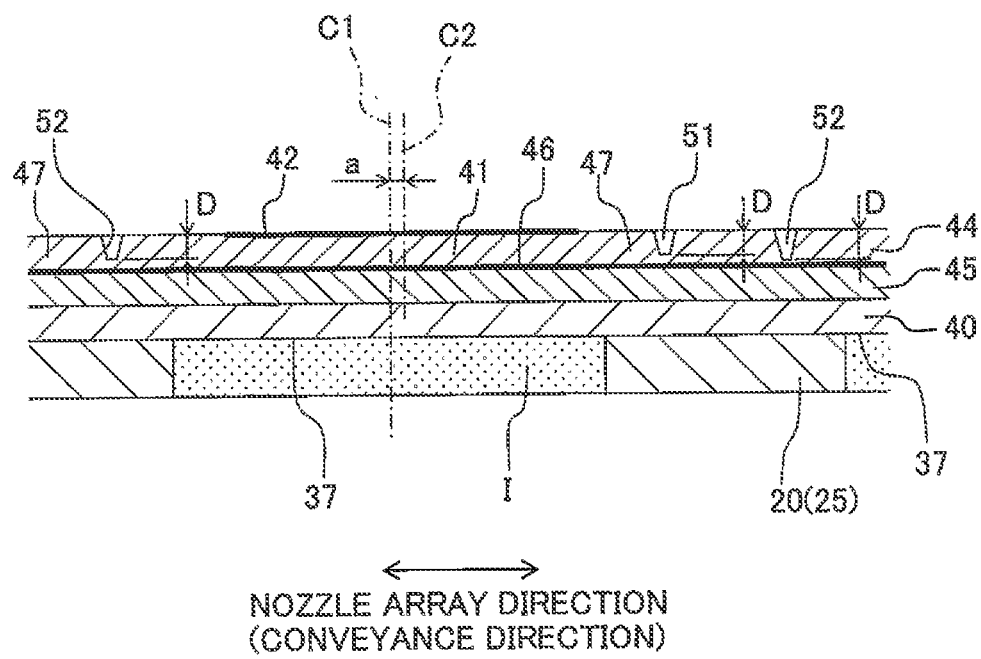
FIG. 15 is a partial cross-sectional view of an ink jet head according to still another modification of the second embodiment.

Further, the wider the grooves 51 (52) or the deeper the grooves 51(52), the more the deformation of the piezoelectric layer 44, and thus the more the amount of volume change of the pressure chamber 37. Hence, as depicted in FIGS. 14 and 15, a groove width C or a groove depth D of each groove 51 (52) may be made different among the plurality of pressure chambers 37. If the grooves 51 (52) are formed by laser processing, then it is possible to easily make the groove width C or the groove depth D different by changing radiation energy or radiation time of the laser light.

Further, among the plurality of pressure chambers 37, two or more of the groove formation conditions may be made different respectively among the abovementioned groove position A, groove length B, groove width C, and groove depth D.

As the parameter related to the ink jet speed from the nozzle 34 for determining the position or shape of each groove, there are other ones as follows than the amount of positional deviation 'a' of the individual electrode 42, exemplified in the above second embodiment. Further, it is possible to use a single one or a combination of these parameters.

(a) Because of the factors such as the variation in the thickness of the piezoelectric layer 44, the variation in the size of the individual electrodes 42, and the like, among multiple parts of the active portion 41 sandwiched between the plurality of individual electrodes 42 and the common electrode, there is variation in capacitance. The higher the capacitance of the active portion 41, the more the deformation of the piezoelectric layer 44 for the pressure chamber 37 and thus the more the amount of volume change of the pressure chamber 37 such that, as a result, the higher the ink jet speed, too. Therefore, at the stage of manufacturing the piezoelectric actuator 21, the capacitance of the multiple parts of the active portion 41 is measured and recorded beforehand. Hence, the positions or shapes of the respectively corresponding plurality of grooves 51 (52) may be made different according to the values of capacitance of those multiple parts of the active portion 41.

(b) Because of the factors such as the variation in the thickness of the piezoelectric layers 44 and 45, among such parts of the piezoelectric layers 44 and 45 as respectively covering the plurality of pressure chambers 37, there is variation in natural frequency.

A high natural frequency means a high rigidity of the parts of the piezoelectric layers 44 and 45 covering a pressure chamber 37. On deforming, the piezoelectric layers 44 and 45 receive a pressure from the ink of the pressure chamber 37. At this time, if the rigidity of the piezoelectric layers 44 and 45 is high (the natural frequency is high), then it is possible for the piezoelectric layers 44 and 45 to deform in spite of the pressure from the ink. That is, the higher the natural frequency of the piezoelectric layers 44 and 45, the more the deformation of the piezoelectric layers 44 and 45, and thus the higher the ink jet speed too. Hence, the positions or shapes of the respectively corresponding plurality of grooves 51 (52) may be made different according to the natural frequency of the piezoelectric layers 44 and 45 covering the plurality of pressure chambers 37.

(c) Because of some manufacturing error in forming the plurality of nozzles 34 in the nozzle plate 29, there is variation in the diameter of each jet orifice 34a among the plurality of nozzles 34. The smaller the diameter of the jet orifice 34a of a nozzle 34, the higher the speed of jetting the ink from that nozzle 34. Hence, the positions or shapes of the respectively corresponding plurality of grooves 51 (52) may be made different according to the diameters of the jet orifices 34a of the plurality of nozzles 34.

(d) If different types of inks are jetted from the nozzles 34, then the lower the viscosity of the inks, the higher the ink jet speed. Hence, the positions or shapes of the respectively corresponding plurality of grooves 51 (52) may be made different according to the viscosity of the ink jetted from each of the plurality of nozzles 34.

Figure 12C:
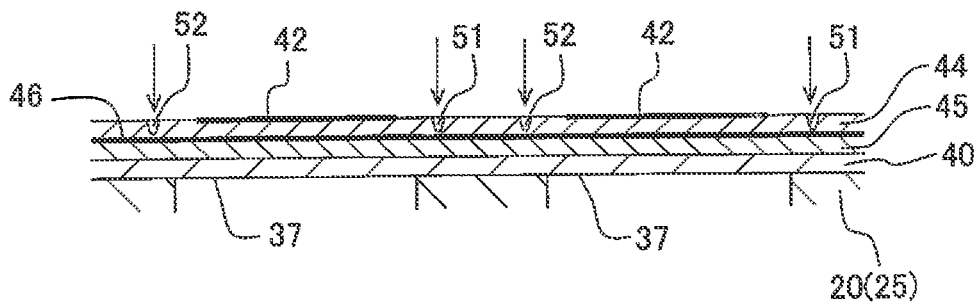

In the above second embodiment, as depicted in FIG. 12C, the grooves 51 and 52 are formed in the piezoelectric layer 44 after the piezoelectric actuator 21 is joined to the channel unit 20. In contrast to this, if the parameter related to the ink jet speed can already be acquired before the junction process, then the grooves 51 and 52 may be formed in the piezoelectric layer 44 before the junction. For example, before the junction process, it is possible to acquire such parameters as the diameters of the jet orifices 34a of the nozzles 34, the types of the inks to be jetted from the nozzles 34, and the like.

Figure 16:
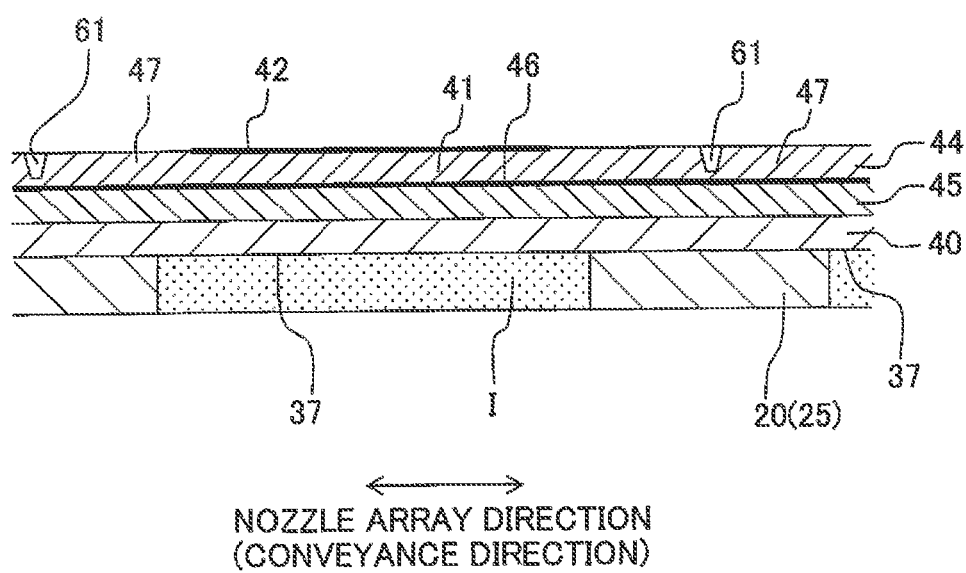
FIG. 16 is a partial cross-sectional view of an ink jet head according to still another modification of the second embodiment.

In the above second embodiment, as depicted in FIGS. 5 and 10, two grooves 51 and 52 are formed in the portion 47 of the piezoelectric layer 44 between two adjacent pressure chambers 37. In contrast to this, as depicted in FIG. 16, only one groove 61 may be formed in the portion 47 of the piezoelectric layer 44 between two pressure chambers 37. In this configuration, the one groove 61 present between two pressure chambers 37 facilitates the deformation of the piezoelectric layer 44 for the two pressure chambers 37 on its two sides respectively.

Further, in the above embodiments, the grooves 51 (52) are formed in the piezoelectric layer 44 at positions adjacent to the pressure chambers 37 in the nozzle array direction (the longitudinal direction of the pressure chambers 37). However, the grooves may be formed at positions adjacent to the pressure chambers 37 according to the scanning direction (the short-length direction of the pressure chambers 37). Further, each groove may be formed all around one pressure chamber 37 to encircle the same.

If each one groove is provided close to both of two pressure chambers 37, then that one groove affects the amount of volume change of both of the two pressure chambers 37 on its two sides and, as a result, affects the ink jet speed of each of the two nozzles 34. In such cases, therefore, if the groove position or shape is determined only on the basis of the parameter about the nozzle 34 in communication with one of the two pressure chambers 37 between the two pressure chambers 37 adjacent to the groove (for example, the amount of positional deviation 'a' of the individual electrode 42 with respect to the pressure chamber 37), then because no consideration is made on that groove affecting the nozzle 34 in communication with the other pressure chamber 37, it is possible, on the contrary, to increase the variation in the jet speed. Therefore, in such cases as mentioned above, it is preferable for the positions or shapes of the plurality of grooves to differ according to the parameter related to the jet speed of each of the two nozzles 34 in communication with the two pressure chambers 37 adjacent to each groove.

As depicted in FIG. 16, for example, if one groove 61 is present between two pressure chambers 37, then the position or shape of the groove 61 is determined according to a mean value to be obtained from the parameter related to the jet speed of the two nozzles 34 in communication with two pressure chambers 37 (for example, the amount of positional deviation 'a' of the individual electrode 42, or the like).

On the other hand, as depicted in FIG. 10, if two grooves 51 and 52 are present between two pressure chambers 37, then as compared to the configuration of FIG. 16, it can be regarded that the groove 51 (52) close to one pressure chamber 37 less affects the pressure chamber 37 on the other side. However, if the portion 47 of the piezoelectric layer 44 has a narrow width W2 between the pressure chambers 37 according to the nozzle array direction, then it is not possible to ignore the groove 51 (52) affecting the other pressure chamber 37. Therefore, the positions or shapes of the grooves 51 and 52 are determined for the configuration of FIG. 10 in the following manner.

If the width W2 of the portion 47 of the piezoelectric layer 44 between the pressure chambers 37 is not less than a predetermined width W0 and if the width of the portion 47 is sufficiently large, then the position or shape of each of the grooves 51 and 52 is determined only according to the parameter of the nozzle 34 in communication with the closer pressure chamber 37. On the other hand, if the width W2 of the portion 47 of the piezoelectric layer 44 between the pressure chambers 37 is less than the predetermined width W0, then the position or shape of each of the grooves 51 and 52 is determined according to the parameter of each of the two nozzles 34 in communication with the two pressure chambers 37. Further, between two pressure chambers 37, the groove 51 (52) more affects the pressure chamber 37 closer to that groove 51 (52). Hence, in determining the positions or shapes of the grooves 51 (52), it is desirable to apply weights according to the affecting degree such as multiplying the parameter of the nozzle 34 in communication with the closer pressure chamber 37 by a larger weight coefficient, while multiplying the parameter of the nozzle 34 in communication with the other pressure chamber 37 by a smaller weight coefficient. Further, it is possible to set the predetermined width W0 of the portion 47 of the piezoelectric layer 44 to, for example, 25% of the separation distance (distance between the centers) of two adjacent pressure chambers 37 in the nozzle array direction.

It is not necessary to determine all of the plurality of grooves, which are provided respectively around the plurality of pressure chambers 37 (the plurality of nozzles 34), according to the parameter related to the jet speed of the corresponding nozzles 34 such that all the grooves differ in position or shape. For example, it is possible to divide the plurality of nozzles 34 into a plurality of groups by bringing together similar nozzles 34 at close jet speeds, so as to determine the positions or shapes of the grooves in units of those groups. That is, among the nozzles 34 belonging to one group, the groove positions and shapes are all the same, whereas among the nozzles 34 belonging to different groups, the groove positions or shapes are different.

The channel unit and the piezoelectric actuator are not limited to the configurations of the above embodiments. For example, the number of piezoelectric layers of the piezoelectric actuator is not limited to two, but can be changed as appropriate. Further, the pressure chambers 37 and their corresponding individual electrodes 42 are not limited to the shapes of the above embodiments. For example, while the individual electrodes 42 are arranged on the piezoelectric layer 44 at the opposite side from the pressure chambers 37 in the above embodiments, they may be arranged at the same side as the pressure chambers 37.

In the above second embodiment, for the purpose of reducing the variation in the ink jet speed from the plurality of nozzles 34 in one ink jet head 4, the condition for forming each groove of the piezoelectric actuator 21 is determined on the basis of the parameter related to the ink jet speed of the corresponding nozzle 34. In contrast to this, it is also possible to apply the present teaching for reducing the difference in the jet speed among a plurality of ink jet heads 4. That is, in manufacturing a plurality of ink jet heads 4, the groove formation condition for each ink jet head 4 is determined on the basis of the parameter related to the jet speed in the ink jet head 4. That is, by adjusting the groove formation condition for each ink jet head 4, among the plurality of ink jet heads 4, it is possible to reduce the variation in the ink jet speed from the nozzles 34.

Figure 17:
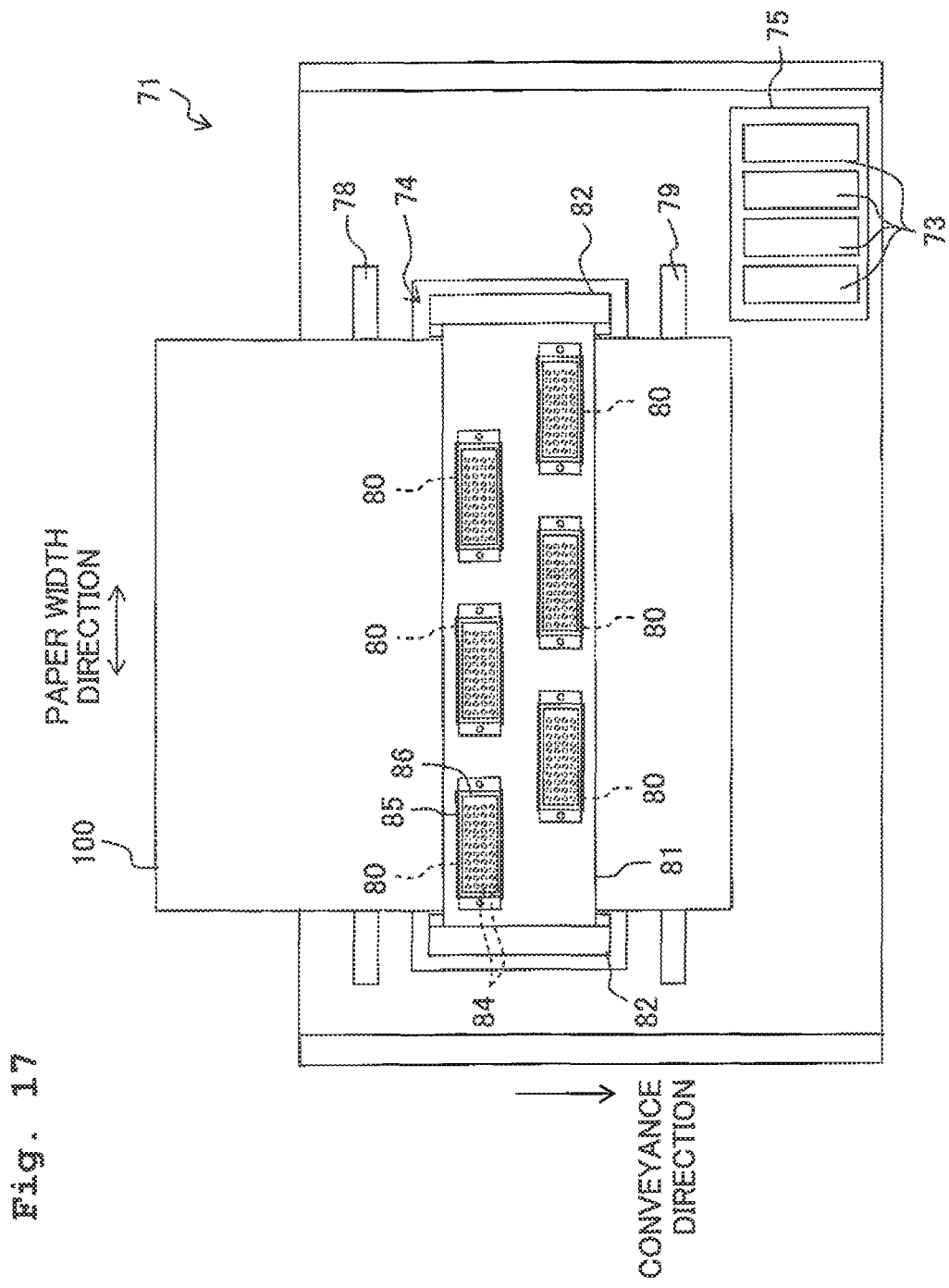
FIG. 17 is a schematic plan view of an ink jet printer according to still another modification of the second embodiment.

The ink jet head may be configured to combine a plurality of head units each have a plurality of nozzles. An ink jet printer 71 shown in FIG. 17 includes a line ink jet head 74 elongated in a width direction of the recording paper 100. The ink jet head 74 has six head units 80 aligned along the paper width direction. The six head units 80 are fitted on a plate-like head holder 81. The head holder 81 is supported in a horizontal posture by two support members 82 on the left and on the right. The ink jet head 74 is supplied with four color inks from ink cartridges 73 installed in a holder 75. The ink jet head 74 records images on the recording paper 100 by jetting the inks respectively from nozzles 84 of the six head units 80, to the recording paper 100 transported by conveyance rollers 78 and 79.

Each head unit 80 has a channel unit 85 and a piezoelectric actuator 86. The channel units 85 and the piezoelectric actuators 86 each have the same configurations as those of the ink jet head of the first embodiment shown in FIG. 2. The channel units 85 each have a plurality of nozzles 84 arrayed in four rows in the lower surface, and a plurality of pressure chambers (not shown) in respective communication with the plurality of nozzles 84. Further, although detailed illustration is omitted, the piezoelectric actuators 86 each have piezoelectric layers, and a plurality of individual electrodes and the like corresponding respectively to the plurality of pressure chambers of the channel unit 85. Further, in the same manner as in the above embodiments, a plurality of grooves are formed in the piezoelectric layer around each of the plurality of pressure chambers.

In the ink jet head 74, among the six head units 80, the grooves of the piezoelectric actuators 86 have different positions or shapes according to the parameter related to the ink jet speed from the nozzles 84 (for example, the amount of positional deviation 'a' and the like depicted in FIG. 10 for the above second embodiment). By virtue of this, among the six head units 80, even if variation arises in the ink jet speed from the nozzles 84, because the jet speed is corrected by the different positions or shapes of the grooves among the six head units 80, it is still possible to keep the variation low in the jet speed among the six head units 80. Further, in the above configuration, the head units 80 correspond to the liquid jet unit of the present teaching.

In the above embodiments, the present teaching is applied to an ink discharge apparatus which jets inks to recording paper to print images and the like thereon. However, the present teaching may also be applied to any liquid discharge apparatus used for various purposes other than printing images and the like. For example, it is possible. to apply the present teaching to liquid discharge apparatuses which jet an electrically conductive liquid to a substrate to form a conductive pattern on a surface of the substrate.

What is claimed is:

1. A liquid discharge apparatus configured to discharge liquid, comprising:
   a channel structure in which liquid channels are formed to include:
      a plurality of nozzles aligned in an array direction; and
      a plurality of pressure chambers communicating with the plurality of nozzles respectively and aligned in the array direction; and
   a piezoelectric actuator including a piezoelectric layer arranged on the channel structure to cover the plurality of pressure chambers,
   wherein for each of the plurality of pressure chambers, two grooves are formed in the piezoelectric layer to locate on two sides of each pressure chamber in the array direction, and to extend respectively in an orthogonal direction orthogonal to the array direction;
   wherein among the plurality of pressure chambers, there is an equal separation distance between the two grooves arranged on the two sides of the pressure chamber; and
   wherein, when letting X be positions of the grooves from an edge of the pressure chamber in the array direction, and letting Xc be a center position between the edge of the pressure chamber to the edge of an adjacent other pressure chamber in the array direction, the positions X of the grooves satisfy $0.2Xc-20\ \mu m \le X \le 0.6Xc +20\ \mu m$.

2. The liquid discharge apparatus according to claim 1;
   wherein the positions X of the grooves satisfy $0.2Xc \le X \le 0.6Xc$.

3. The liquid discharge apparatus according to claim 2;
   wherein the positions X of the grooves satisfy $0.35Xc \le X \le 0.6Xc$.

4. The liquid discharge apparatus according to claim 3;
   wherein the positions X of the grooves satisfy $0.42Xc \le X \le 0.55Xc$.

5. The liquid discharge apparatus according to claim 1;
   wherein the piezoelectric actuator further includes:
      a plurality of individual electrodes provided on the piezoelectric layer to face the plurality of pressure chambers respectively; and
      a common electrode arranged on the opposite side from the plurality of individual electrodes across the piezoelectric layer to face the plurality of individual electrodes;
   wherein the two grooves are formed respectively in a portion of the piezoelectric layer around each of the plurality of pressure chambers; and
   wherein the two grooves differ in position or shape according to a parameter related to a jet speed of the liquid from the corresponding nozzle.

6. The liquid discharge apparatus according to claim 5;
   wherein each of the two grooves differs in position or shape according to the parameter for each of the two nozzles in communication with the two pressure chambers adjacent to the groove.

7. The liquid discharge apparatus according to claim 5;
   wherein the two grooves differ in position according to the parameter.

8. The liquid discharge apparatus according to claim 5;
   wherein the two grooves differ in length according to the parameter.

9. The liquid discharge apparatus according to claim 5;
wherein the two grooves differ in depth according to the parameter.

10. The liquid discharge apparatus according to claim 5;
wherein the parameter includes an amount of positional deviation in a planar direction of the piezoelectric layer between the pressure chambers and the individual electrodes.

11. The liquid discharge apparatus according to claim 5;
wherein the parameter includes capacitance of an active portion of the piezoelectric layer sandwiched between the individual electrodes and the common electrode.

12. The liquid discharge apparatus according to claim 5;
wherein the parameter includes a diameter of jet orifices of the nozzles.

13. The liquid discharge apparatus according to claim 5;
wherein the parameter includes viscosity of the liquid jetted from the nozzles.

14. A method for manufacturing a liquid discharge apparatus which includes:
a channel structure in which liquid channels are formed to include a plurality of nozzles aligned in an array direction, and a plurality of pressure chambers communicating with the plurality of nozzles respectively and aligned in the array direction; and
a piezoelectric actuator including a piezoelectric layer arranged on the channel structure to cover the plurality of pressure chambers;
wherein the method comprises:
forming two grooves in the piezoelectric layer to locate on two sides of each pressure chamber in the array direction, and to extend respectively in an orthogonal direction orthogonal to the array direction, for each of the plurality of pressure chambers such that, among the plurality of pressure chambers, there is an equal separation distance between the two grooves;
wherein, when letting X be positions of the grooves from an edge of the pressure chamber according to the array direction, and letting Xc be a center position between the edge of the pressure chamber to the edge of an adjacent other pressure chamber according to the array direction, a target formation positions Xm for the grooves are set to a value within the range of $0.2Xc \leq Xm \leq 0.6Xc$ to form the grooves.

15. A liquid discharge apparatus configured to discharge liquid comprising:
a channel structure in which liquid channels are formed to include
a plurality of nozzles; and
a plurality of pressure chambers communicating with the plurality of nozzles respectively; and
a piezoelectric actuator provided on the channel structure;
wherein the piezoelectric actuator includes:
a piezoelectric layer arranged to cover the plurality of pressure chambers;
a plurality of individual electrodes provided on the piezoelectric layer to face the plurality of pressure chambers respectively;
a common electrode arranged on the opposite side from the plurality of individual electrodes across the piezoelectric layer to face the plurality of individual electrodes; and
a plurality of grooves formed respectively in a portion of the piezoelectric layer around each of the plurality of pressure chambers;
wherein the plurality of pressure chambers includes:
a first pressure chamber; and
a second pressure chamber which is different from the first pressure chamber;
wherein the plurality of grooves includes:
a first groove formed in a first portion of the piezoelectric layer adjacent to the first pressure chamber; and
a second groove formed in a second portion of the piezoelectric layer adjacent to the second pressure chamber; and
wherein:
a distance between the first groove and the first pressure chamber differs from a distance between the second groove and the second pressure chamber according to a parameter related to a jet speed of the liquid from the corresponding nozzle; or
a shape of the first groove differs from a shape of the second groove according to a parameter related to a jet speed of the liquid from the corresponding nozzle.

16. A liquid discharge apparatus configured to discharge liquid, comprising:
a plurality of liquid jet units;
wherein each of the liquid jet units comprises:
a channel structure in which liquid channels are formed to include:
a plurality of nozzles; and
a plurality of pressure chambers communicating with the plurality of nozzles; and
a piezoelectric actuator provided on the channel structure;
wherein each piezoelectric actuator includes:
a piezoelectric layer arranged to cover the plurality of pressure chambers;
a plurality of individual electrodes provided on the piezoelectric layer to face the plurality of pressure chambers respectively;
a common electrode arranged on the opposite side from the plurality of individual electrodes across the piezoelectric layer to face the plurality of individual electrodes; and
a plurality of grooves formed respectively in a portion of the piezoelectric layer around each of the plurality of pressure chambers; and
wherein the plurality of liquid jet units includes:
a first liquid jet unit; and
a second liquid jet unit which is different from the first liquid jet unit;
wherein the piezoelectric actuator of the first liquid jet unit has a plurality of first grooves as the plurality of grooves;
wherein the piezoelectric actuator of the second liquid jet unit has a plurality of second grooves as the plurality of grooves;
wherein:
distances between the first grooves and the pressure chambers they surround differ from distances between the second grooves and the pressure chambers they surround according to a parameter related to a jet speed of the liquid from the corresponding nozzle; or
shapes of the first grooves differ from shapes of the second grooves according to a parameter related to a jet speed of the liquid from the corresponding nozzle.

17. A method for manufacturing a liquid discharge apparatus which includes:
a channel structure in which liquid channels are formed to include:
a plurality of nozzles; and
a plurality of pressure chambers communicating with the plurality of nozzles respectively;

wherein the plurality of pressure chambers includes:
- a first pressure chamber which communicates with a first nozzle of the plurality of nozzles; and
- a second pressure chamber which is different from the first pressure chamber, and which communicates with a second nozzle of the plurality of nozzles; and a piezoelectric actuator provided on the channel structure;

wherein the piezoelectric actuator includes:
- a piezoelectric layer arranged on the channel structure to cover the plurality of pressure chambers;
- a plurality of individual electrodes provided on the piezoelectric layer to face the plurality of pressure chambers respectively; and
- a common electrode arranged on the opposite side from the plurality of individual electrodes across the piezoelectric layer to face the plurality of individual electrodes;

wherein the method comprises:
- determining a first groove formation condition related to position or shape of a first groove corresponding to the first pressure chamber communicating with the first nozzle, based on a parameter related to a jet speed of the liquid from the first nozzle;
- determining a second groove formation condition related to position or shape of a second groove corresponding to the second pressure chamber communicating with the second nozzle, based on a parameter related to a jet speed of the liquid from the second nozzle; and
- forming the first groove in piezoelectric layer adjacent to the first pressure chamber based on the determined first groove formation condition; and
- forming the second groove in piezoelectric layer adjacent to the second pressure chamber based on the determined second groove formation condition;

wherein the first groove and the second groove are formed so that:
- a distance between the first groove and the first pressure chamber differs from a distance between the second groove and the second pressure chamber according to a parameter related to a jet speed of the liquid from the corresponding nozzle; or
- a shape of the first groove differs from a shape of the second groove according to a parameter related to a jet speed of the liquid from the corresponding nozzle.

\* \* \* \* \*